(12) United States Patent
Kariya et al.

(10) Patent No.: US 7,817,440 B2
(45) Date of Patent: Oct. 19, 2010

(54) MULTILAYER PRINTED WIRING BOARD

(75) Inventors: Takashi Kariya, Ibi-gun (JP); Hironori Tanaka, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/608,568

(22) Filed: Oct. 29, 2009

(65) Prior Publication Data

US 2010/0064512 A1    Mar. 18, 2010

Related U.S. Application Data

(63) Continuation of application No. 11/917,085, filed as application No. PCT/JP2006/311943 on Jun. 14, 2006, now Pat. No. 7,649,748.

(30) Foreign Application Priority Data

Jun. 15, 2005    (JP) .............................. 2005-175575

(51) Int. Cl.
*H05K 1/18* (2006.01)

(52) U.S. Cl. .................. 361/763; 361/782; 361/767; 361/793; 361/795; 361/766; 174/261; 174/262

(58) Field of Classification Search .............. 174/260, 174/261, 262; 361/299.1, 299.3, 298.4, 301.1, 361/306.3, 272, 275.1, 728, 729, 736, 738, 361/748, 749, 760, 761, 763, 766, 767, 782, 361/783, 793, 795, 808, 811, 821; 257/532, 257/535, E29.343, E23.144, E21.008; 29/834, 29/850, 832, 829, 852, 846, 842, 831

See application file for complete search history.

(56) References Cited

U.S. PATENT DOCUMENTS

| 5,177,670 | A | 1/1993 | Shinohara et al. |
| 6,333,857 | B1 * | 12/2001 | Kanbe et al. ............... 361/792 |
| 6,809,268 | B2 | 10/2004 | Hayashi et al. |
| 6,876,554 | B1 | 4/2005 | Inagaki et al. |
| 7,092,237 | B2 | 8/2006 | Lee et al. |
| 7,307,852 | B2 | 12/2007 | Inagaki et al. |

(Continued)

FOREIGN PATENT DOCUMENTS

JP    8 32197    2/1996

(Continued)

*Primary Examiner*—Dameon E Levi
*Assistant Examiner*—Hoa C Nguyen
(74) *Attorney, Agent, or Firm*—Oblon, Spivak, McClelland, Maier & Neustadt, L.L.P.

(57) ABSTRACT

A multilayer printed wiring board includes a mounting portion supporting a semiconductor device and a layered capacitor portion including first and second layered electrodes and a ceramic high-dielectric layer therebetween. The first layered electrode is connected to a ground line and the second layered electrode is connected to a power supply line. The ratio of number of via holes, each constituting a conducting path part electrically connecting a ground pad to the ground line of a wiring pattern and passing through the second layered electrode in non-contact, to number of ground pads is 0.05 to 0.7. The ratio of number of second rod-shaped conductors, each constituting a conducting path part electrically connecting a power supply pad to the power supply line of the wiring pattern and passing through the first layered electrode in non-contact, to number of power supply pad is 0.05 to 0.7.

17 Claims, 12 Drawing Sheets

U.S. PATENT DOCUMENTS

| | | | |
|---|---|---|---|
| 7,525,814 B2 | 4/2009 | Yuri et al. | |
| 2002/0118523 A1* | 8/2002 | Okabe et al. | 361/793 |
| 2003/0063453 A1 | 4/2003 | Kusagaya et al. | |
| 2004/0057192 A1* | 3/2004 | Galvagni et al. | 361/306.3 |
| 2004/0209398 A1 | 10/2004 | Iijima et al. | |
| 2004/0231885 A1* | 11/2004 | Borland et al. | 174/260 |
| 2005/0121772 A1* | 6/2005 | Hayashi et al. | 257/700 |
| 2005/0122662 A1* | 6/2005 | Hayashi et al. | 361/306.3 |
| 2005/0157478 A1 | 7/2005 | Inagaki et al. | |
| 2006/0215380 A1 | 9/2006 | Lu et al. | |
| 2007/0089826 A1* | 4/2007 | Ueno et al. | 156/64 |

FOREIGN PATENT DOCUMENTS

| | | |
|---|---|---|
| JP | 11 260148 | 9/1999 |
| JP | 2001 36253 | 2/2001 |
| JP | 2001 68858 | 3/2001 |
| JP | 2001 326293 | 11/2001 |
| JP | 2001 352141 | 12/2001 |

* cited by examiner

MULTILAYER PRINTED WIRING BOARD

CROSS-REFERENCE TO RELATED APPLICATIONS

This application is a continuation of and claims the benefit of priority from U.S. Ser. No. 11/917,085, filed Dec. 10, 2007, the entire contents of which are incorporated herein by reference. U.S. Ser. No. 11/917,085 is a National Stage of International Patent Application No. PCT/JP2006/311943, filed Jun. 14, 2006, and claims priority from Japanese Patent Application No. 2005-175575, filed Jun. 15, 2005, which is hereby incorporated by reference herein in its entirety.

TECHNICAL FIELD

The present invention relates to a multilayer printed wiring board including a built-up portion in which a plurality of wiring patterns that are stacked with insulating layers therebetween are electrically connected through via holes provided in the insulating layers.

BACKGROUND ART

Hitherto, various types of structures of a multilayer printed wiring board including a built-up portion in which a plurality of wiring patterns that are stacked with insulating layers therebetween are electrically connected through via holes provided in the insulating layers have been proposed. For example, in such a multilayer printed wiring board, when a semiconductor device mounted is switched between the on and off states at a high speed, switching noise may be generated, resulting in an instantaneous drop in the electric potential of a power supply line. In order to suppress such an instantaneous drop in the electric potential, connection of a capacitor portion between the power supply line and a ground line to perform decoupling has been proposed. In Patent Document 1, provision of a layered capacitor portion functioning as such a capacitor portion in a multilayer printed wiring board has been proposed. Patent Document 1: Japanese Unexamined Patent Application Publication No. 2001-68858

DISCLOSURE OF INVENTION

However, since the layered capacitor portion disclosed in Patent Document 1 includes a dielectric layer made of an organic resin containing an inorganic filler such as barium titanate, the dielectric layer cannot have a satisfactorily high capacitance. Accordingly, it is difficult to achieve a satisfactory decoupling effect under a condition that the frequency for switching between the on and off states of a semiconductor device is high, i.e., in the range of several gigahertz to several tens of gigahertz in which an instantaneous drop in the electric potential easily occurs. In addition, malfunctioning of the semiconductor device after a heat cycle test cannot be satisfactorily prevented.

The present invention has been conceived in view of the above problems, and it is an object of the present invention to provide a multilayer printed wiring board in which a satisfactory decoupling effect can be achieved, and malfunctioning of a semiconductor device can also be satisfactorily prevented.

In order to achieve the above object, the present invention provides the following means.

The present invention provides a multilayer printed wiring board includes a built-up portion in which a plurality of wiring patterns stacked with insulating layers therebetween are electrically connected to each other though via holes provided in the insulating layers; a mounting portion on which a semiconductor device electrically connected to the wiring patterns can be mounted and which includes first pads each connected to one of a ground electrode and a power supply electrode of the semiconductor device, and second pads each connected to the other of the ground electrode and the power supply electrode of the semiconductor device; and a layered capacitor portion which is provided between the mounting portion and the built-up portion, which includes a ceramic high-dielectric layer, a first layered electrode, and a second layered electrode, the first layered electrode and the second layered electrode sandwiching the high-dielectric layer and having different electric potentials, and in which the first layered electrode is electrically connected to the first pads so as to have the same electric potential as the first pads and the second layered electrode is electrically connected to the second pads so as to have the same electric potential as the second pads. In this multilayer printed wiring board, the ratio of the number of first rod-shaped conductors, each of which constitutes at least a part of a conducting path that electrically connects the first pads to a ground line or a power supply line of the wiring patterns and which passes through the second layered electrode in a non-contact manner, to the number of first pads is in the range of 0.05 to 0.7, and the ratio of the number of second rod-shaped conductors, each of which constitutes at least a part of a conducting path that electrically connects the second pads to the power supply line or the ground line of the wiring patterns and which passes through the first layered electrode in a non-contact manner, to the number of second pads is in the range of 0.05 to 0.7.

In this multilayer printed wiring board, the high-dielectric layer of the layered capacitor portion connected between the power supply line and the ground line is made of a ceramic. Accordingly, the dielectric constant of the high-dielectric layer can be higher than that of a known dielectric layer made of an organic resin containing an inorganic filler, and thus the capacitance of the layered capacitor portion can be increased. Accordingly, a satisfactory decoupling effect can be achieved even under a condition that the frequency for switching between the on and off states of the semiconductor device is high, i.e., in the range of several gigahertz to several tens of gigahertz (e.g., 3 GHz to 20 GHz) in which an instantaneous drop in the electric potential easily occurs. In addition, since the ratio of the number of first rod-shaped conductors to the number of first pads is in the range of 0.05 to 0.7 and the ratio of the number of second rod-shaped conductors to the number of second pads is in the range of 0.05 to 0.7, malfunctioning of the semiconductor device can be satisfactorily prevented. The reason for this is not exactly known but is believed to be as follows. In the case where these ratios are lower than 0.05, since the number of each type of the rod-shaped conductors is small, when any of the rod-shaped conductors is degraded, other rod-shaped conductors may not adequately compensate for the effect of this degradation. In the case where these ratios are higher than 0.7, the number of portions of each type of layered electrode where a rod-shaped conductor passes in a non-contact manner increases. Consequently, a brittle ceramic high-dielectric layer easily contracts or expands due to a difference in the thermal expansion between such a portion and the high-dielectric layer. As a result, cracks are easily generated in the high-dielectric layer.

In the multilayer printed wiring board of the present invention, the high-dielectric layer is preferably prepared by sintering a high-dielectric material separately from the built-up portion, and the sintered high-dielectric layer is preferably joined onto the built-up portion. In general, since the built-up portion is prepared under a temperature condition of 200° C. or lower, it is difficult to sinter a high-dielectric material to form a ceramic layer. Therefore, a ceramic layer is preferably formed by sintering a high-dielectric material separately from the built-up portion. Preferable examples of such a high-dielectric layer include, but are not particularly limited to, layers prepared by sintering a raw material containing at least one metal oxide selected from the group consisting of barium titanate ($BaTiO_3$), strontium titanate ($SrTiO_3$), tantalum oxides ($TaO_3$ and $Ta_2O_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT).

In the multilayer printed wiring board of the present invention, the second rod-shaped conductors may be independent rod-shaped conductors penetrating through not only the first layered electrode but also the second layered electrode in a non-contact manner. In this case, it is necessary to electrically connect the second pads to the second layered electrode separately from these independent rod-shaped conductors.

In the multilayer printed wiring board of the present invention, the first layered electrode may be provided on the lower surface of the high-dielectric layer as a solid pattern having passing holes through which the second rod-shaped conductors pass in a non-contact manner, and the second layered electrode may be provided on the upper surface of the high-dielectric layer as a solid pattern having passing holes through which the first rod-shaped conductors pass in a non-contact manner. In this structure, since the areas of the first and second layered electrodes of the layered capacitor portion can be increased, the capacitance of the layered capacitor portion can be increased. The solid patterns may be provided on a part of or the entirety of the upper surface or the lower surface of the high-dielectric layer.

In the printed wiring board of the present invention, some of the first pads may include the first rod-shaped conductors, and the rest of the first pads may not include any of the first rod-shaped conductors and may be electrically connected to the first pads including the first rod-shaped conductors, and some of the second pads may include the second rod-shaped conductors, and the rest of the second pads may not include any of the second rod-shaped conductors and may be electrically connected to the second pads including the second rod-shaped conductors. In this structure, the number of passing holes through which the first rod-shaped conductors pass the second layered electrode in a non-contact manner and the number of passing holes through which the second rod-shaped conductors pass the first layered electrode in a non-contact manner are decreased. Accordingly, the areas of the first and second layered electrodes can be increased, and the capacitance of the layered capacitor portion can also be increased. Furthermore, the printed wiring board can be easily designed so that the ratio of the number of first rod-shaped conductors to the number of first pads and the ratio of the number of second rod-shaped conductors to the number of second pads are within the range of 0.05 to 0.7.

In the multilayer printed wiring board of the present invention, at least some of the first rod-shaped conductors and at least some of the second rod-shaped conductors may be alternately arranged in a grid pattern or a checkered pattern. In this structure, since the loop inductance is decreased, an instantaneous drop in the electric potential of the power supply can be easily prevented.

In the multilayer printed wiring board of the present invention, the distance between the first layered electrode and the second layered electrode of the layered capacitor portion may be 10 µm or less, which is a distance at which short circuits do not substantially occur. In this case, since the distance between the electrodes of the layered capacitor portion is sufficiently small, the capacitance of the layered capacitor portion can be increased.

In the multilayer printed wiring board of the present invention, the layered capacitor portion is preferably provided directly under the semiconductor device mounted on the mounting portion. In this structure, the electric power can be supplied to the semiconductor device with a minimum possible wire length. Accordingly, a satisfactory decoupling effect can be achieved even in a semiconductor device in which the interval between the on state and the off state is short, i.e., in the range of several gigahertz to several tens of gigahertz (e.g., 3 GHz to 20 GHz), and thus, the power supply shortage does not easily occur.

The multilayer printed wiring board of the present invention may further include a chip capacitor which is disposed at the side of a surface having the mounting portion thereon and which is connected to the first layered electrode and the second layered electrode of the layered capacitor portion. In this structure, when the capacitance is not sufficient only in the layered capacitor portion, the chip capacitor can compensate for the shortage. As the length of the wiring between the chip capacitor and the semiconductor device increases, the decoupling effect decreases. In this case, however, since the chip capacitor is disposed at the side of the surface having the mounting portion thereon, the length of the wiring between the chip capacitor and the semiconductor device can be small, and thus a decrease in the decoupling effect can be suppressed. Furthermore, since the chip capacitor is connected to the semiconductor device via the layered capacitor portion, a loss of the power supply from the chip capacitor to the semiconductor device can be decreased.

The multilayer printed wiring board of the present invention may further include a stress relief portion which is provided between the mounting portion and the layered capacitor portion and which is made of an elastic material. In this structure, even when a stress due to a difference in thermal expansion is generated between the semiconductor device mounted on the mounting portion and the layered capacitor portion or the built-up portion, the stress relief portion absorbs the stress, and thus problems such as a decrease in the connection reliability and a decrease in the insulation reliability do not easily occur. Although cracks are easily generated in the high-dielectric layer of the layered capacitor portion because of its small thickness and brittleness, the presence of the stress relief portion can prevent the generation of cracks. In this case, the stress relief portion may be provided in an area only directly under the semiconductor device mounted on the mounting portion. A problem of a stress due to a difference in thermal expansion mainly occurs in the area directly under the semiconductor device. Therefore, when the stress relief portion is provided on this area, the cost of the material can be reduced. Examples of the material of the stress relief portion include, but are not particularly limited to, organic resin sheets such as a modified epoxy resin sheet, a polyphenylene ether resin sheet, a polyimide resin sheet, a cyanoester resin sheet, and an imide resin sheet. These organic resin sheets may contain a thermoplastic resin such as a polyolefin resin or a polyimide resin; a thermosetting resin such as a silicone resin; or a rubber resin such as styrene-butadiene rubber (SBR), acrylonitrile-butadiene rubber (NBR), or a urethane. These organic resin sheets may also contain fibers, fillers, or flakes made of an inorganic material such as silica, alumina, or zirconia. The stress relief portion preferably has a Young's modulus in the range of 10 to 1,000 MPa. In the case where the Young's modulus of the stress relief portion is within the above range, even when a stress due to a difference in the coefficient of thermal expansion between the semiconductor device mounted on the mounting portion and the layered capacitor portion is generated, the stress can be relieved.

BEST MODE FOR CARRYING OUT THE INVENTION

First Embodiment

Figure 1:
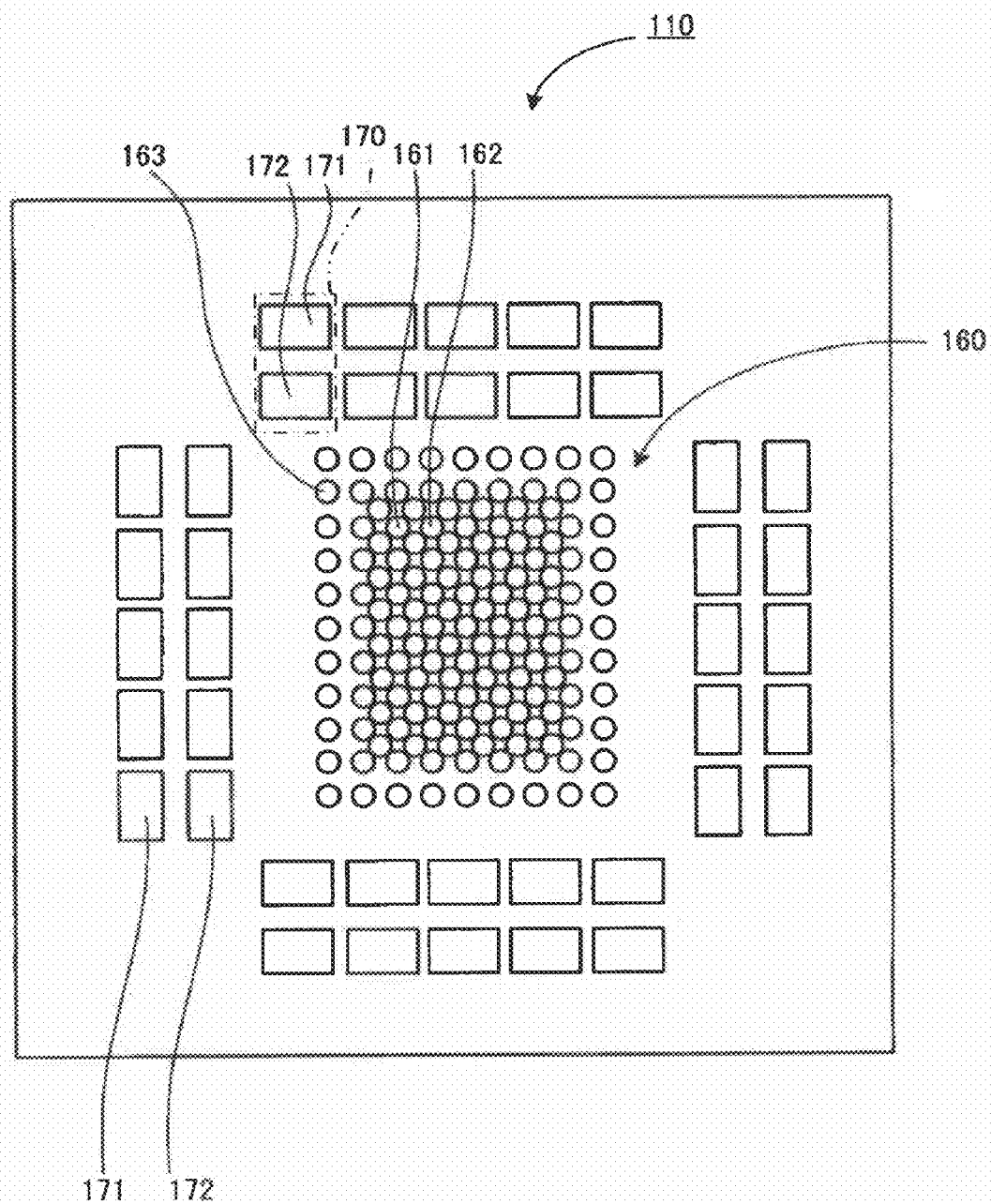
FIG. 1 is a plan view of a multilayer printed wiring board 110 according to a first embodiment.

Embodiments of the present invention will now be described with reference to the drawings. FIG. 1 is a plan view of a multilayer printed wiring board 110 according to a first embodiment of the present invention, FIG. 2 is a longitudinal cross-sectional view of the multilayer printed wiring board 110 (which shows only the part to the left of the center line), and FIG. 3 is a schematic perspective view showing a layered capacitor portion 140.

Figure 2:
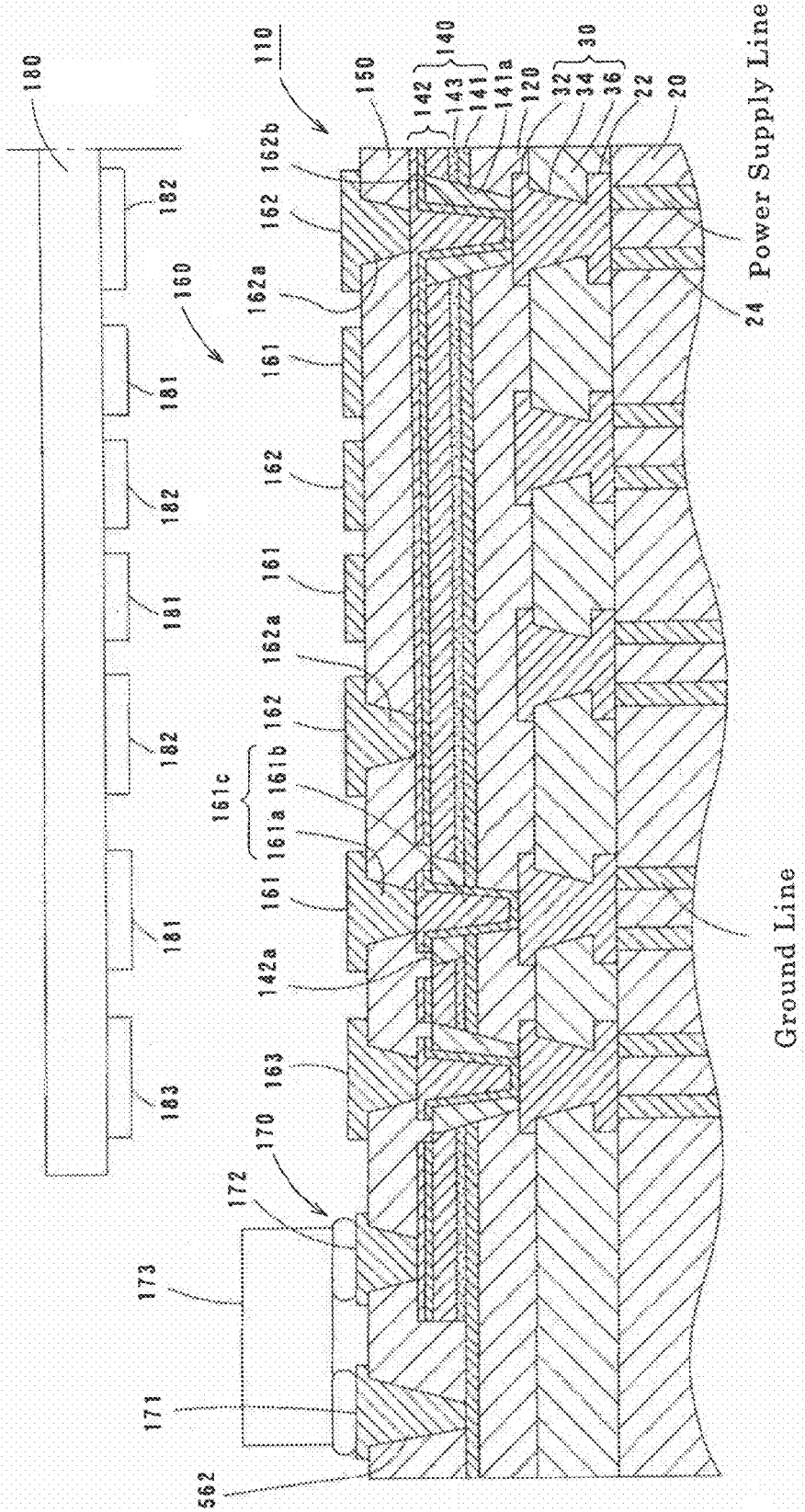
FIG. 2 is a longitudinal cross-sectional view of the multilayer printed wiring board 110 according to the first embodiment.
Figure 3:
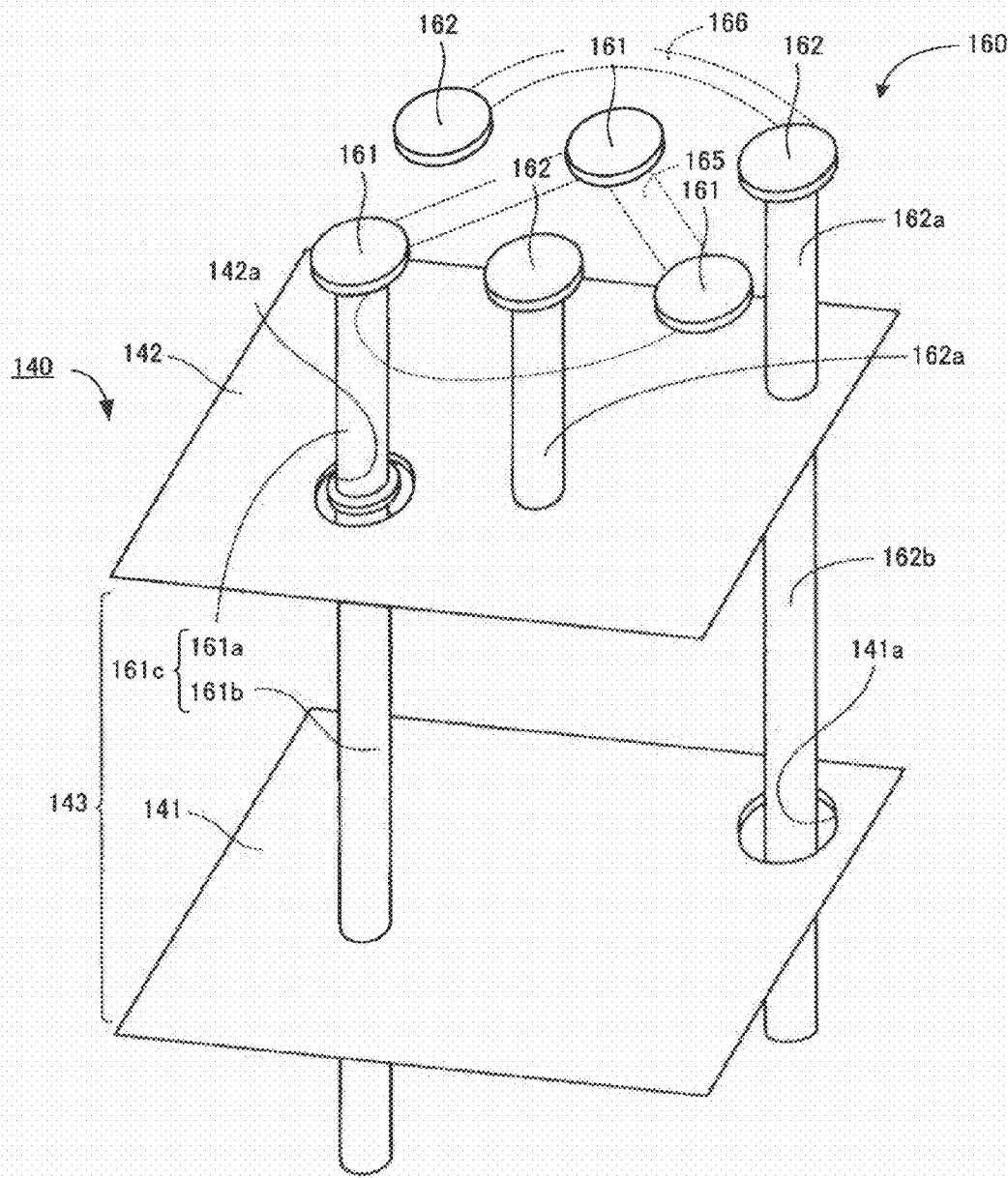
FIG. 3 is a schematic perspective view showing a layered capacitor portion 140.
Figure 4:
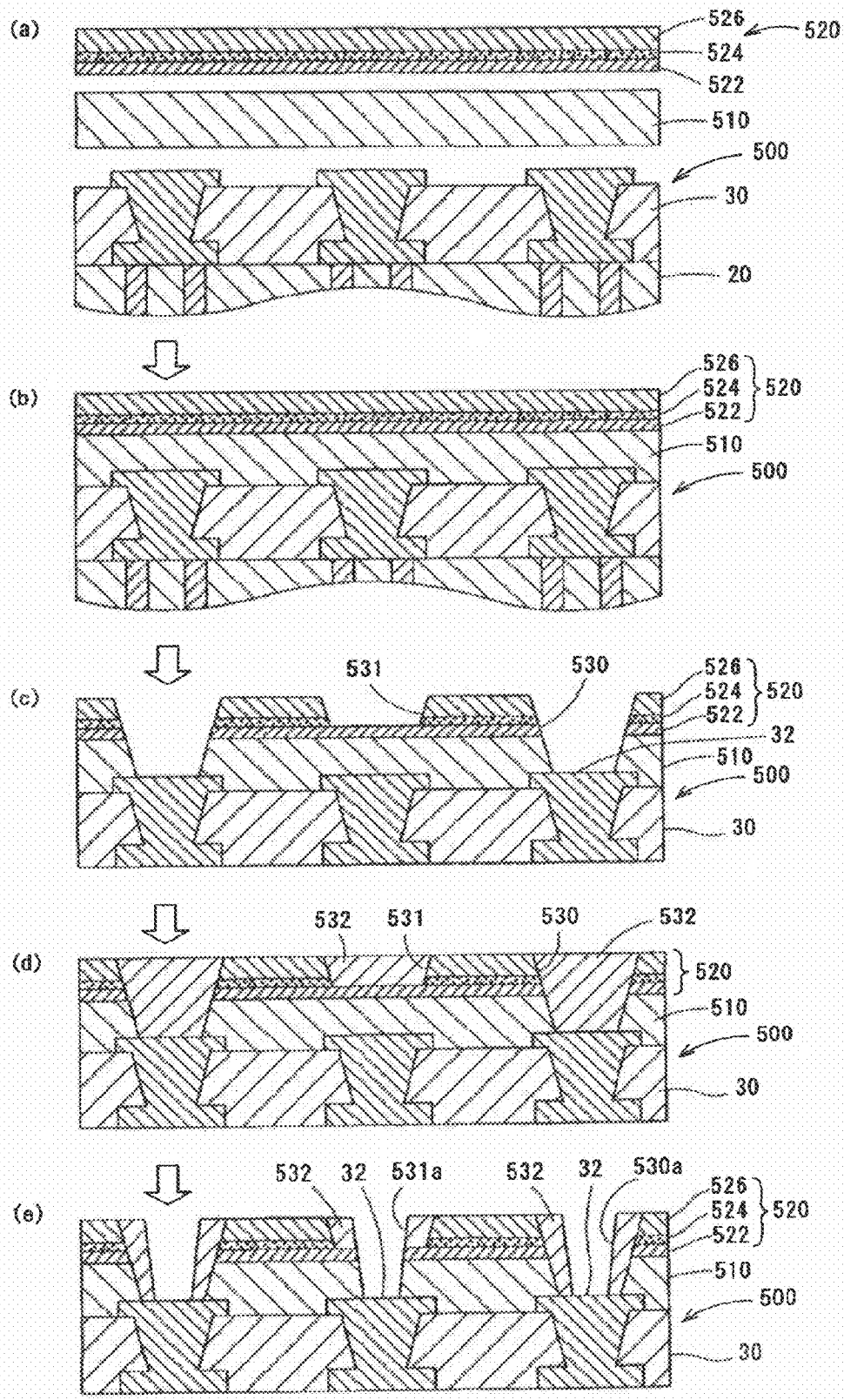
FIG. 4 includes views illustrating a process of producing the multilayer printed wiring board 110.
Figure 5:
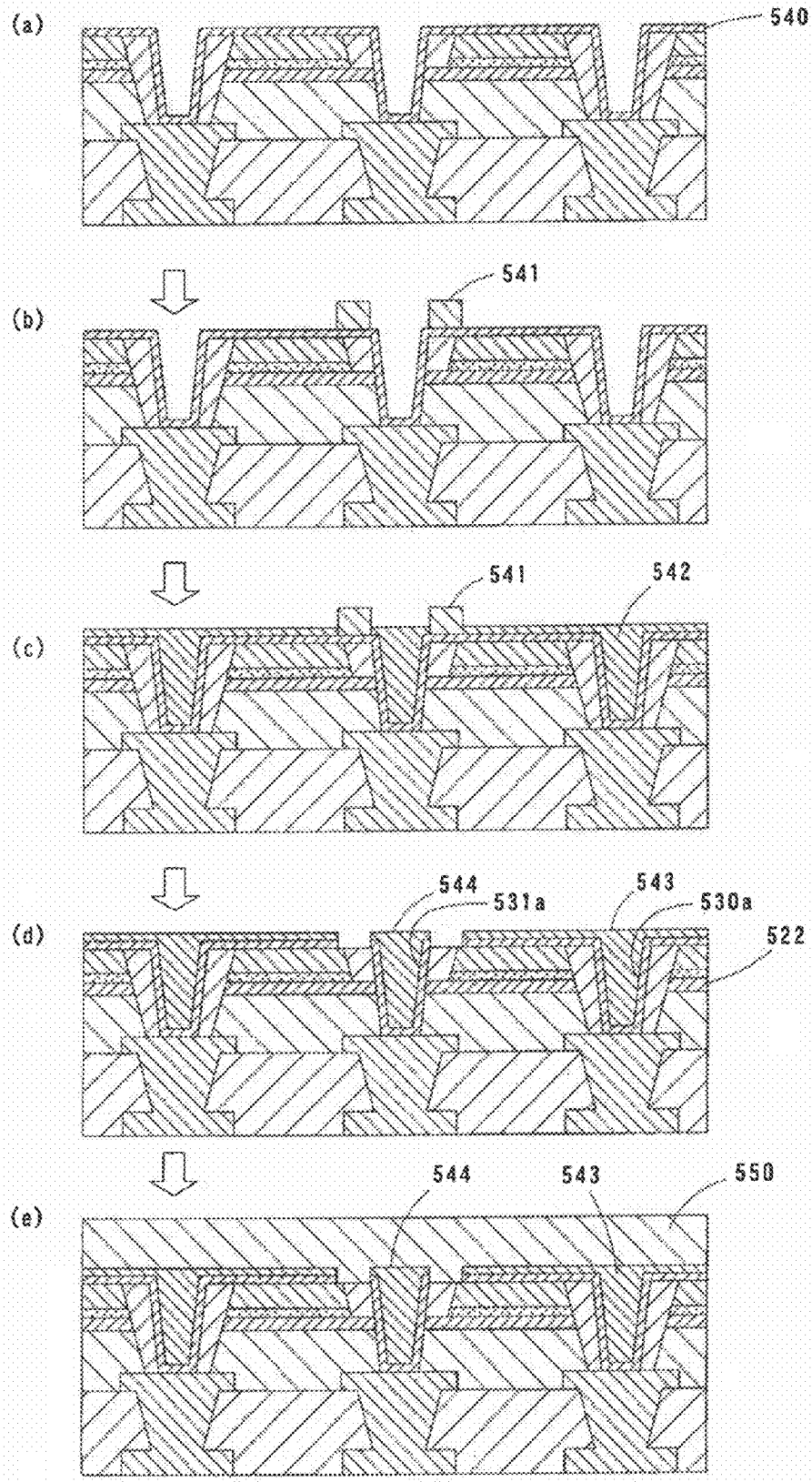
FIG. 5 includes views illustrating the process of producing the multilayer printed wiring board 110.

As shown in FIG. 2, the multilayer printed wiring board 110 of this embodiment includes a core substrate 20 in which wiring patterns 22 provided on the upper surface and the lower surface of the substrate are electrically connected to each other via through-hole conductors 24; a built-up portion 30 in which a plurality of wiring patterns 32 and 22, which are stacked with a resin insulating layer 36 therebetween, are electrically connected through via holes 34, the built-up portion 30 being provided on the upper surface of the core substrate 20; an interlayer insulating layer 120 stacked on the built-up portion 30; a layered capacitor portion 140 which is stacked on the interlayer insulating layer 120 and which includes a first layered electrode 141, a second layered electrode 142, and a high-dielectric layer 143 provided between the first layered electrode 141 and the second layered electrode 142; a stress relief portion 150 which is stacked on the layered capacitor portion 140 and which is made of an elastic material; a mounting portion 160 on which a semiconductor device 180 is mounted; and chip capacitor arrangement areas 170 provided around the mounting portion 160. The built-up portion 30 may have a multilayered structure.

In the layered capacitor portion 140 of this embodiment, the first layered electrode 141 is a copper electrode and is electrically connected to ground pads 161 of the mounting portion 160 through via holes 161a. The second layered electrode 142 is a copper electrode and is electrically connected to power supply pads 162 through via holes 162a. Accordingly, the first layered electrode 141 and the second layered electrode 142 are connected to ground electrodes 181 and power supply electrodes 182, respectively, of the semiconductor device 180 to be mounted on the mounting portion 160.

The first layered electrode 141 is a solid pattern provided on the lower surface of the high-dielectric layer 143 and includes passing holes 141a through which second rod-shaped conductors 162b, which are via holes connected to the second layered electrode 142, penetrate in a non-contact manner. The second rod-shaped conductors 162b are provided so as to correspond to some of the power supply pads 162 and designed so that the ratio of the number of second rod-shaped conductors 162b to the number of power supply pads 162 is in the range of 0.05 to 0.7. The reason for this is as follows. Among all of the power supply pads 162, some of the power supply pads 162 are electrically connected to the second layered electrode 142 through the via holes 162a. The other power supply pads 162 are electrically connected to other power supply pads 162 that are electrically connected to the second layered electrode 142 through the via holes 162a with a wiring (for example, a wiring 166 provided on the mounting portion 160 shown in FIG. 3). Accordingly, all of the power supply pads 162 are connected to the second layered electrode 142. When at least one second rod-shaped conductor 162b extending from the second layered electrode 142 downward is provided, all of the power supply pads 162 can be connected to an external power supply line through the second rod-shaped conductor 162b. As described above, when the second rod-shaped conductors 162b are provided so as to correspond to some of the power supply pads 162, the number of passing holes 141a provided in the first layered electrode 141 can be reduced. Consequently, the area of the first layered electrode 141 can be increased to increase the capacitance of the layered capacitor portion 140. In addition, since the ratio of the number of second rod-shaped conductors 162b to the number of power supply pads 162 is in the range of 0.05 to 0.7, as demonstrated in the experimental examples described below, malfunctioning of the semiconductor device 180 mounted on the mounting portion 160 can be satisfactorily prevented. The number of passing holes 141a and the positions at which the passing holes 141a are formed are determined with consideration of the capacitance of the layered capacitor portion 140, the arrangement of the via holes 162a, and the like.

On the other hand, the second layered electrode 142 is a solid pattern provided on the upper surface of the high-dielectric layer 143 and includes passing holes 142a through which first rod-shaped conductors 161c, which are composed of via holes 161a and 161b connected to the ground pads 161, penetrate in a non-contact manner. The first rod-shaped conductors 161c are provided so as to correspond to some of the ground pads 161 and designed so that the ratio of the number of first rod-shaped conductors 161c to the number of ground pads 161 is in the range of 0.05 to 0.7. The reason for this is as follows. The ground pads 161 are electrically connected to each other with a wiring (for example, a wiring 165 provided on the mounting portion 160 shown in FIG. 3). Accordingly, at least one first rod-shaped conductor 161c that extends downward from a ground pad 161 and that is in contact with the first layered electrode 141 without being in contact with the second layered electrode 142 is provided, all of the ground pads 161 can be connected to an external ground line through the first rod-shaped conductor 161c. In addition, when the first rod-shaped conductors 161c are provided so as to correspond to some of the ground pads 161, the number of passing holes 142a provided in the second layered electrode 142 can be reduced. Consequently, the area of the second layered electrode 142 can be increased to increase the capacitance of the layered capacitor portion 140. In addition, since the ratio of the number of first rod-shaped conductors 161c to the number of ground pads 161 is in the range of 0.05 to 0.7, as demonstrated in the experimental examples described below, malfunctioning of the semiconductor device 180 mounted on the mounting portion 160 can be satisfactorily prevented. The number of passing holes 142a and the positions at which the passing holes 142a are formed are determined with consideration of the capacitance of the layered capacitor portion 140, the arrangement of the via holes 161a, and the like.

Since the capacitance of the layered capacitor portion 140 can be increased as described above, a sufficient decoupling effect can be achieved and the power supply shortage of a transistor of the semiconductor device 180 (IC) mounted on the mounting portion 160 does not easily occur. The wiring that electrically connects ground pads 161, for which a via hole is not provided directly thereunder, to ground pads 161, for which a via hole is provided directly thereunder, and the wiring that electrically connects power supply pads 162, for which a via hole is not provided directly thereunder, to power supply pads 162, for which a via hole is provided directly thereunder, may be provided on the mounting portion 160. Alternatively, these wirings may be provided on the surface of the core substrate 20 or on the built-up portion 30. Alternatively, a wiring layer may be further provided between the layered capacitor portion 140 and the mounting portion 160, and the connection may be established with the wiring layer.

The stress relief portion 150 is made of an elastic material. Examples of the elastic material include, but are not particularly limited to, organic resin sheets such as a modified epoxy resin sheet, a polyphenylene ether resin sheet, a polyimide resin sheet, a cyanoester resin sheet, and an imide resin sheet. These organic resin sheets may contain a thermoplastic resin such as a polyolefin resin or a polyimide resin; a thermosetting resin such as a silicone resin; or a rubber resin such as SBR, NBR, or a urethane. These organic resin sheets may also contain fibers, fillers, or flakes made of an inorganic material such as silica, alumina, or zirconia. The stress relief portion 150 preferably has a low Young's modulus in the range of 10 to 1,000 MPa. In the case where the Young's modulus of the stress relief portion 150 is within the above range, even when a stress due to a difference in the coefficient of thermal expansion between the semiconductor device 180 mounted on the mounting portion 160 and the layered capacitor portion 140, the built-up portion 30, or the core substrate 20 is generated, the stress can be relieved.

The mounting portion 160 is an area on which the semiconductor device 180 is mounted and is provided on the surface of the multilayer printed wiring board 110. The ground pads 161, the power supply pads 162, and pads 163 for a signal, all of which are provided on the mounting portion 160, are arranged in a grid pattern or a checkered pattern (see FIG. 1). The pads 163 for a signal are terminals connected to signal electrodes 183 of the semiconductor device 180. In this embodiment, the ground pads 161 and the power supply pads 162 are arranged near the center in a grid pattern or a checkered pattern, and the pads 163 for a signal are arranged around the pads 161 and 162 in a grid pattern, a checkered pattern, or at random. The total number of pads of the mounting portion 160 is in the range of 1,000 to 30,000. A plurality of chip capacitor arrangement areas 170 are provided around the mounting portion 160. A plurality of pairs of ground pads 171 and power supply pads 172 that are used for connecting to terminals for a ground and terminals for a power supply, respectively, of a chip capacitor 173 are provided in each of the chip capacitor arrangement areas 170.

Each of the ground pads 171 is connected to a negative electrode of an external power supply via the first layered electrode 141 of the layered capacitor portion 140. Each of the power supply pads 172 is connected to a positive electrode of the external power supply via the second layered electrode 142. In this embodiment, the ground pads 161 correspond to first pads, and the power supply pads 162 correspond to second pads.

A process of producing the multilayer printed wiring board 110 of this embodiment will now be described with reference to FIGS. 4 to 7.

First, as shown in FIG. 4(a), a substrate 500 in which a built-up portion 30 was provided on at least one surface of a core substrate 20 was prepared. An interlayer insulating layer 510 (which was to be formed into the interlayer insulating layer 120 shown in FIG. 1, a thermosetting insulating film, manufactured by Ajinomoto Co., Inc., ABF-45SH) was bonded onto the built-up portion 30 using a vacuum laminator under laminating conditions at a temperature in the range of 50° C. to 150° C. and at a pressure in the range of 0.5 to 1.5 MPa. Subsequently, a high-dielectric sheet 520 prepared in advance and having a structure in which a high-dielectric layer 524 was sandwiched between copper foils 522 and 526 was bonded onto the interlayer insulating layer 510 using a vacuum laminator under laminating conditions at a temperature in the range of 50° C. to 150° C. and at a pressure in the range of 0.5 to 1.5 MPa and was then dried at 150° C. for one hour (see FIG. 4(b)). The copper foils 522 and 526 of the high-dielectric sheet 520 used in this lamination are preferably solid layers on which no circuits are formed. When a part of the copper foils 522 and 526 are removed by etching or the like, for example, the following problems occur: (i) The high-dielectric sheet may be bent or broken because the residual ratios of the metal become different between the upper surface and the lower surface of the high-dielectric sheet, or the high-dielectric sheet may be bent or broken from a portion where a copper foil is removed. (ii) When a part of a copper foil is removed, corner portions (see FIG. 7) are formed, and the lamination pressure is concentrated on the corner portions. (iii) The laminator is directly in contact with the high-dielectric layer. As a result, cracks are easily generated in the high-dielectric layer, and when the cracked portions are filled with a plating film in a subsequent plating step, the copper foils are short-circuited. Furthermore, when a part of the electrode is removed before lamination, a problem of a decrease in the capacitance of the high-dielectric sheet occurs. When such a high-dielectric sheet is laminated, it is necessary to align the positions of the high-dielectric sheet and the built-up portion and to bond them to each other. Furthermore, since the high-dielectric sheet has a small thickness and does not have rigidity, the positional accuracy during the removal of a part of a copper foil is degraded. In addition, since a part of a copper foil must be removed with consideration of the alignment accuracy, a larger part of the copper foil must be removed. Furthermore, the alignment accuracy is not satisfactory because of the small thickness of the high-dielectric sheet. Accordingly, the copper foils 522 and 526 of the high-dielectric sheet 520 used in the lamination are preferably solid layers on which no circuits are formed.

A process of preparing a high-dielectric sheet 520 will now be described.

(1) Diethoxybarium and titanium bitetraisopropoxide were weighed in a dry nitrogen atmosphere so as to prepare a solution with a concentration of 1.0 mol/liter, and then dissolved in a mixed solvent (volume ratio 3:2) of dehydrated methanol and 2-methoxyethanol. The solution was stirred at room temperature in a nitrogen atmosphere for three days to prepare an alkoxide precursor composition solution containing barium and titanium. The precursor composition solution was then stirred while the temperature was maintained at 0° C. Decarbonated water was sprayed into the solution at a rate of 0.5 microliter/min in a nitrogen gas stream to perform hydrolysis.

(2) A sol-gel solution thus prepared was filtered using a 0.2 µm-filter to remove precipitates and the like.

(3) The filtrate prepared in (2) above was applied onto a copper foil 522 (which was to be formed into the first layered electrode 141 in subsequent steps) having a thickness of 12 µm by spin coating at 1,500 rpm for one minute. The substrate on which the solution was spin-coated was placed on a hot plate maintained at 150° C. for three minutes to dry the solution. The substrate was then placed in an electric furnace maintained at 850° C., and sintering was performed for 15 minutes. In this process, the viscosity of the sol-gel solution was adjusted so that the film thickness obtained by performing a series of spin-coating, drying, and sintering once was 0.03 µm. Instead of copper, other metals such as nickel, platinum, gold, or silver may be used for the first layered electrode 141.

(4) The spin-coating, drying, and sintering were repeated 40 times to prepare a high-dielectric layer 524 having a thickness of 1.2 µm.

(5) Subsequently, a copper layer was formed on the high-dielectric layer 524 using a vacuum deposition system such as a sputtering system. Furthermore, a copper layer having a thickness of about 10 µm was formed on the copper layer by electrolytic plating or the like, thereby forming a copper foil 526 (which was to be formed into a part of the second layered electrode 142 in subsequent steps). Thus, the high-dielectric sheet 520 was obtained. The dielectric characteristics of the high-dielectric sheet 520 were measured using an IMPEDANCE/GAIN PHASE ANALYZER (manufactured by Hewlett-Packard Development Company L.P., name of product: 4194A) under the conditions at a frequency of 1 kHz, at a temperature of 25° C., and an OSC level of 1 V. The relative dielectric constant was 1,850. Instead of the deposited copper layer, another metal layer such as a platinum layer or a gold layer may be formed by vacuum deposition. Instead of the electrolytically plated copper layer, another metal layer such as a nickel layer or a tin layer may be formed by electrolytic plating. In this embodiment, the high-dielectric layer is made of barium titanate. Alternatively, by using another sol-gel solution, the high-dielectric layer made of strontium titanate (SrTiO$_3$), a tantalum oxide (TaO$_3$ or Ta$_2$O$_5$), lead zirconate titanate (PZT), lead lanthanum zirconate titanate (PLZT), lead niobium zirconate titanate (PNZT), lead calcium zirconate titanate (PCZT), or lead strontium zirconate titanate (PSZT) can also be produced.

Another method of producing a high-dielectric sheet 520 is the following method. Specifically, a barium titanate powder (manufactured by Fuji Titanium Industry Co., Ltd., HPBT series) is dispersed in a binder solution prepared by mixing 5 parts by weight of polyvinyl alcohol, 50 parts by weight of pure water, and 1 part by weight of dioctyl phthalate or dibutyl phthalate used as a solvent plasticizer relative to the total weight of the barium titanate powder. The dispersion liquid is printed on a copper foil 522 (which is formed into the first layered electrode 141 in subsequent steps) having a thickness of 12 µm so as to form a thin film having a thickness in the range of about 5 to 7 µm using a printing device such as a roll coater, a doctor blade, or an α-coater. The thin film is then dried at 60° C. for one hour, at 80° C. for three hours, at 100° C. for one hour, at 120° C. for one hour, and at 150° C. for three hours to form an unsintered layer. Instead of the paste containing BaTiO$_3$, a paste containing at least one metal oxide selected from the group consisting of SrTiO$_3$, TaO$_3$, Ta$_2$O$_5$, PZT, PLZT, PNZT, PCZT, and PSZT may be printed so as to form a thin film having a thickness in the range of 0.1 to 10 µm using a printing device such as a roll coater or a doctor blade and then dried to form an unsintered layer. After the printing, the unsintered layer is sintered in a temperature range of 600° C. to 950° C. to form a high-dielectric layer 524. Subsequently, a copper layer is formed on the high-dielectric layer 524 using a vacuum deposition system such as a sputtering system. Furthermore, an additional copper layer having a thickness of about 10 µm is formed on the copper layer by electrolytic plating or the like, thereby forming a copper foil 526 (which is formed into a part of the second layered electrode 142 in subsequent steps). Instead of the deposited copper layer, another metal layer such as a platinum layer or a gold layer may be formed by vacuum deposition. Instead of the electrolytically plated copper layer, another metal layer such as a nickel layer or a tin layer may be formed by electrolytic plating. Alternatively, the barium titanate layer may be formed by sputtering using a barium titanate target.

Next, through-holes 530 and 531 were formed at predetermined positions in the above substrate having the high-dielectric sheet 520 thereon using a carbon dioxide gas laser, a UV laser, a YAG laser, an excimer laser, or the like (see FIG. 4(c)). The through-holes 530 having a large depth penetrated through the high-dielectric sheet 520 and the interlayer insulating layer 510 and reached the surface of a wiring pattern 32 of a built-up portion 30. The through-holes 531 having a small depth penetrated through the copper foil 526 and the high-dielectric layer 524 and reached the surface of the copper foil 522. In this embodiment, first, the deep through-holes 530 were formed, and the shallow through-holes 531 were then formed. The depths of the through-holes were controlled by changing the number of laser shots. More specifically, the through-holes 531 were formed using a UV laser device manufactured by Hitachi Via Mechanics, Ltd. under the conditions of an output in the range of 3 to 10 W, at a frequency in the range of 30 to 60 kHz, and with the number of shots of 4. The through-holes 530 were formed under the same conditions as those used for the through-holes 531 except that the number of shots was changed to 31. Subsequently, the through-holes 530 and 531 were filled with a resin 532 for filling through-holes described below, and the resin 532 was then dried at 80° C. for one hour, at 120° C. for one hour, and at 150° C. for 30 minutes (see FIG. 4(d)). The through-holes 530 and 531 were not formed so as to correspond to all of the power supply pads 162 and ground pads 161 shown in FIG. 1.

The resin for filling through-holes was prepared as follows. First, 100 parts by weight of a bisphenol F-type epoxy monomer (manufactured by Yuka-Shell Epoxy Co., Ltd., molecular weight: 310, trade name: E-807) was mixed with 6 parts by weight of an imidazole curing agent (manufactured by Shikoku Chemicals Corporation, trade name: 2E4MZ-CN). Furthermore, 170 parts by weight of spherical SiO$_2$ particles having an average particle diameter of 1.6 µm were mixed to the mixture. The resulting mixture was kneaded with a three-roll mill so that the viscosity of the mixture was in the range of 45,000 to 49,000 cps at 23° C.±1° C. Thus, the resin for filling through-holes was obtained.

Subsequently, through-holes 530a and 531a were formed in the resin 532 for filling through-holes filled in the previous step. The substrate was immersed in a permanganic acid solution to roughen the surfaces of the through-holes 530a and 531a. Subsequently, drying and curing were performed at 170° C. for three hours to completely cure the resin 532 (see FIG. 4(e)). The through-holes 530a penetrated through the resin 532 for filling through-holes and reached the surface of the wiring pattern 32 of the built-up portion 30. On the other hand, the through-holes 531a penetrated through the resin 532 for filling through-holes, the copper foil 522, and the interlayer insulating layer 510 and reached the surface of the wiring pattern 32 of the built-up portion 30. Each of the through-holes 530a was formed using a $CO_2$ laser via a mask diameter of 1.4 mm, at an energy density of 2.0 mj, and a number of shots of 2. Each of the through-holes 531a was formed under the same conditions as those used for the through-holes 530a except that a UV laser was used and the number of shots was changed to 52 (output: 3 to 10 W, frequency: 30 to 60 kHz).

Subsequently, a catalyst for electroless copper plating was applied on the surface of the substrate. The substrate was immersed in the following electroless copper plating solution.

Accordingly, an electroless copper plating film 540 having a thickness in the range of 0.6 to 3.0 μm was formed on the surface of the substrate (see FIG. 5(a)). An aqueous electroless copper plating solution containing 0.03 mol/L copper sulfate, 0.200 mol/L EDTA, 0.1 g/L HCHO, 0.1 mol/L NaOH, 100 mg/L α,α'-bipyridyl, and 0.1 g/L polyethylene glycol (PEG) was used.

Next, a commercially available dry film was applied on the electroless copper plating film 540, exposed, and then developed to form a plating resist 541 (see FIG. 5(b)). Subsequently, an electrolytic copper plating film 542 having a thickness of 25 μm was then formed on portions where the plating resist was not formed (see FIG. 5(c)). An electrolytic copper plating solution containing 200 g/L sulfuric acid, 80 g/L copper sulfate, and 19.5 mL/L additive (manufactured by Atotech Japan, Capalacid GL) was used. The electrolytic copper plating was performed for 115 minutes under the conditions at a current density of 1 A/dm$^2$ and at a temperature of 23° C.±2° C. Subsequently, the plating resist 541 was removed, and a part of the electroless copper plating film 540 disposed under areas where the plating resist 541 remained, i.e., a part of the electroless copper plating film 540 disposed between the electrolytic copper plating films 542 was removed by etching (quick etching) with an etchant containing sulfuric acid and hydrogen peroxide. Accordingly, an upper electrode 543 and a land 544 that is electrically connected to the copper foil 522 were formed (see FIG. 5(d)). The conductor filled in the through-hole 531a and the land 544 correspond to the via hole 161b shown in FIG. 2, and the conductor filled in the through-hole 530a corresponds to the second rod-shaped conductor 162b shown FIG. 2.

Subsequently, a stress relief sheet 550 described below (which was to be formed into the stress relief portion 150 shown in FIG. 1) was applied on the upper electrode 543 and the land 544 under the laminating conditions at a temperature in the range of 50° C. to 150° C. and at a pressure in the range of 0.5 to 1.5 MPa. The stress relief sheet 550 was then dried at 150° C. for one hour (see FIG. 5(e)).

The stress relief sheet 550 was prepared as follows. First, 100 parts by weight of a naphthalene-type epoxy resin (manufactured by Nippon Kayaku Co., Ltd., trade name: NC-7000L), 20 parts by weight of a phenol-xylylene glycol condensation resin (manufacture by Mitsui Chemicals, Inc., trade name: XLC-LL), 90 parts by weight of a carboxylic acid-modified NBR having a Tg of −50° C. (manufactured by JSR Corporation, trade name: XER-91) used as cross-linked rubber particles, and 4 parts by weight of 1-cyanoethyl-2-ethyl-4-methylimidazole were dissolved in 300 parts by weight of ethyl lactate. The resulting resin composition was applied onto a film made of polymethylpentene (TPX) (manufactured by Mitsui Petrochemical Industries, Ltd., trade name: Opulent X-88) with a thickness in the range of 42 to 45 μm using a roll coater (manufactured by Cermatronics Boeki Co., Ltd.). The film was then dried at 80° C. for two hours, at 120° C. for one hour, and at 150° C. for 30 minutes to form a stress relief sheet having a thickens of 40 μm. This stress relief sheet had a Young's modulus of 500 MPa at 30° C.

Figure 6:
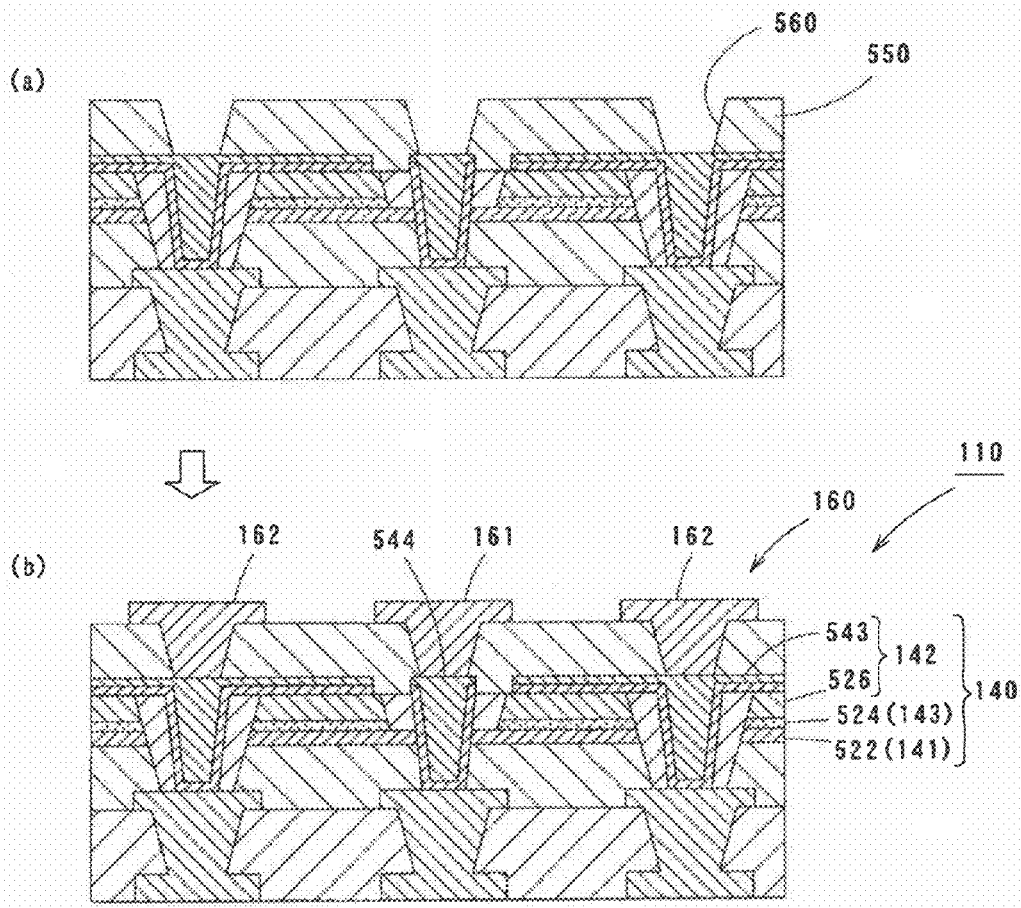
FIG. 6 includes views illustrating the process of producing the multilayer printed wiring board 110.
Figure 7:
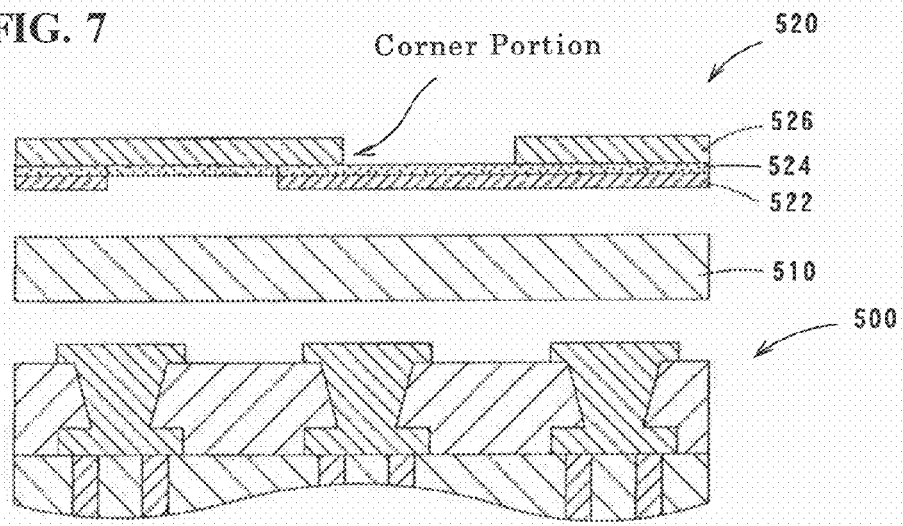
FIG. 7 is a view illustrating a high-dielectric sheet 520 having corner portions.

Via holes 560 were then formed at predetermined positions of the stress relief sheet 550 using a $CO_2$ laser via a mask diameter of 1.4 mm, at an energy density of 2.0 mj, and a number of shots of one (see FIG. 6(a)). Subsequently, a roughening treatment was performed, and drying and curing were performed at 150° C. for three hours to completely cure the stress relief sheet 550. Subsequently, a catalyst application, chemical copper plating, the formation of a plating resist, copper electroplating, the removal of the plating resist, and quick etching were performed to fill each of the via holes 560 with a metal. In addition, a pad (a ground pad 161, a power supply pad 162, or a pad 163 for a signal (not shown in FIG. 6)) was formed as a top surface layer on the upper surface of each of the via holes 560. Thus, a multilayer printed wiring board 110 including a mounting portion 160 was obtained (FIG. 6(b)). The ground pads 161 connected to the lands 544 are connected to a ground line. The power supply pads 162 connected to the upper electrode 543 are connected to a power supply line. The pads 163 for a signal are connected to a signal line. Here, the copper foil 522 corresponds to the first layered electrode 141, the copper foil 526 and the upper electrode 543 correspond to the second layered electrode 142, and the high-dielectric layer 524 corresponds to the high-dielectric layer 143. These constitute the layered capacitor portion 140.

Subsequently, solder bumps may be formed on each terminal of the mounting portion 160. When chip capacitors 173 were mounted as shown in FIG. 1, after the step shown in FIG. 4(b), an etching process (i.e., a tenting process) was performed such that one of the terminals of each of the chip capacitors 173 was electrically connected to the first layered electrode 141 via a conductor 562 (see FIG. 2). An etchant containing cupric chloride was used in the etching process. The process was performed within a short time such that the copper foil 526 and the high-dielectric layer 524 were completely etched, and the copper foil 522 was then slightly etched. Ultimately, a metal layer connected to the copper foil 522 was formed on the stress relief sheet 550, and pads 171 were formed on the upper surface of the metal layer. Each of the pads 172 for connecting to another terminal of each of the chip capacitors 173 was formed on the upper surface of a metal filled in one of the via holes 560 formed on the stress relief sheet 550.

According to the multilayer printed wiring board 110 of this embodiment described above in derail, the high-dielectric layer 143 of the layered capacitor portion 140 connected between the power supply line and the ground line is made of a ceramic.

Accordingly, the dielectric constant can be higher than that of a known dielectric layer made of an organic resin containing an inorganic filler, and thus the capacitance of the layered capacitor portion 140 can be increased. Therefore, since a satisfactory decoupling effect can be achieved even under a condition that the frequency for switching between the on and off states of the semiconductor device 180 is high, i.e., in the range of several gigahertz to several tens of gigahertz (e.g., 3 GHz to 20 GHz), an instantaneous drop in the electric potential does not easily occur.

In addition, the ratio of the number of first rod-shaped conductors 161c to the number of ground pads 161 is in the range of 0.05 to 0.7, and the ratio of the number of second rod-shaped conductors 162b to the number of power supply pads 162 is in the range of 0.05 to 0.7. Accordingly, malfunctioning of the semiconductor device 180 mounted on the mounting portion 160 can be satisfactorily prevented. The reason for this is not exactly known but is believed to be as follows. In the case where these ratios are lower than 0.05, since the number of first rod-shaped conductors 161c and the number of second rod-shaped conductor 162b are small, when the state of electrical connection of any of the rod-shaped conductors is degraded, other rod-shaped conductors may not adequately compensate for the effect of this degradation. In the case where these ratios are higher than 0.7, the number of portions of the first layered electrode 141 through which the second rod-shaped conductor 162b passes in a non-contact manner increases, and the number of portions of the second layered electrode 142 through which the first rod-shaped conductor 161c passes in a non-contact manner increases. Since a resin is filled in these portions, the high-dielectric layer 143 easily contracts or expands. As a result, cracks are easily generated in the brittle ceramic high-dielectric layer 143.

In addition, since the built-up portion 30 is generally prepared under a temperature condition of 200° C. or lower, it is difficult to sinter a high-dielectric material to form a ceramic layer during the formation of the built-up portion 30. However, in the above embodiment, the high-dielectric layer 143 of the layered capacitor portion 140 is made of a ceramic produced by sintering a high-dielectric material separately from the built-up portion 30. Therefore, the dielectric constant of the high-dielectric layer 143 can be easily satisfactorily increased.

Furthermore, the first layered electrode 141 included in the layered capacitor portion 140 is a solid pattern provided on a surface of the high-dielectric layer 143, the surface being distant from the mounting portion 160, that is, on the lower surface of the high-dielectric layer 143. The second layered electrode 142 is a solid pattern provided on another surface of the high-dielectric layer 143, the surface being close to the mounting portion 160, that is, on the upper surface of the high-dielectric layer 143. The second layered electrode 142 includes a passing hole 142a through which the via hole 161a connected to the first layered electrode 141 passes in a non-contact manner. Accordingly, the areas of the layered electrodes 141 and 142 can be satisfactorily increased, and thus the capacitance of the layered capacitor portion 140 can be increased. At least some of the first rod-shaped conductors 161c connected to the first layered electrode 141 and at least some of the second rod-shaped conductors 162b connected to the second layered electrode 142 are alternately arranged in a grid pattern. Accordingly, since the loop inductance is decreased, an instantaneous drop in the electric potential of the power supply can be easily prevented. The first rod-shaped conductors 161c and the second rod-shaped conductors 162b may be alternately arranged in a checkered pattern. In such a case, the same advantage can be achieved.

Furthermore, the distance between the first layered electrode 141 and the second layered electrode 142 of the layered capacitor portion 140 is 10 µm or less, which is a distance at which short circuits do not substantially occur. Accordingly, the distance between the electrodes of the layered capacitor portion 140 is sufficiently small, and thus the capacitance of the layered capacitor portion 140 can be increased.

When the capacitance is not sufficient only in the layered capacitor portion 140, the chip capacitor 173 can compensate for the shortage. That is, the chip capacitor 173 can be provided according to need. As the length of the wiring between the chip capacitor 173 and the semiconductor device 180 increases, the decoupling effect decreases. In this case, however, since the chip capacitor 173 is disposed on the surface having the mounting portion 160 thereon, the distance between the chip capacitor 173 and the semiconductor device 180 can be small, and thus a decrease in the decoupling effect can be suppressed.

In addition, even when a stress due to a difference in thermal expansion is generated between the semiconductor device 180 mounted on the mounting portion 160 and the layered capacitor portion 140 or the built-up portion 130, the stress relief portion 150 absorbs the stress, and thus problems do not easily occur. The stress relief portion 150 may be provided in an area only directly under the semiconductor device 180 mounted on the mounting portion 160. A problem of a stress due to a difference in thermal expansion mainly occurs in the area directly under the semiconductor device 180. Therefore, when the stress relief portion 150 is provided on this area, the cost of the material can be reduced.

Second Embodiment

Figure 8:
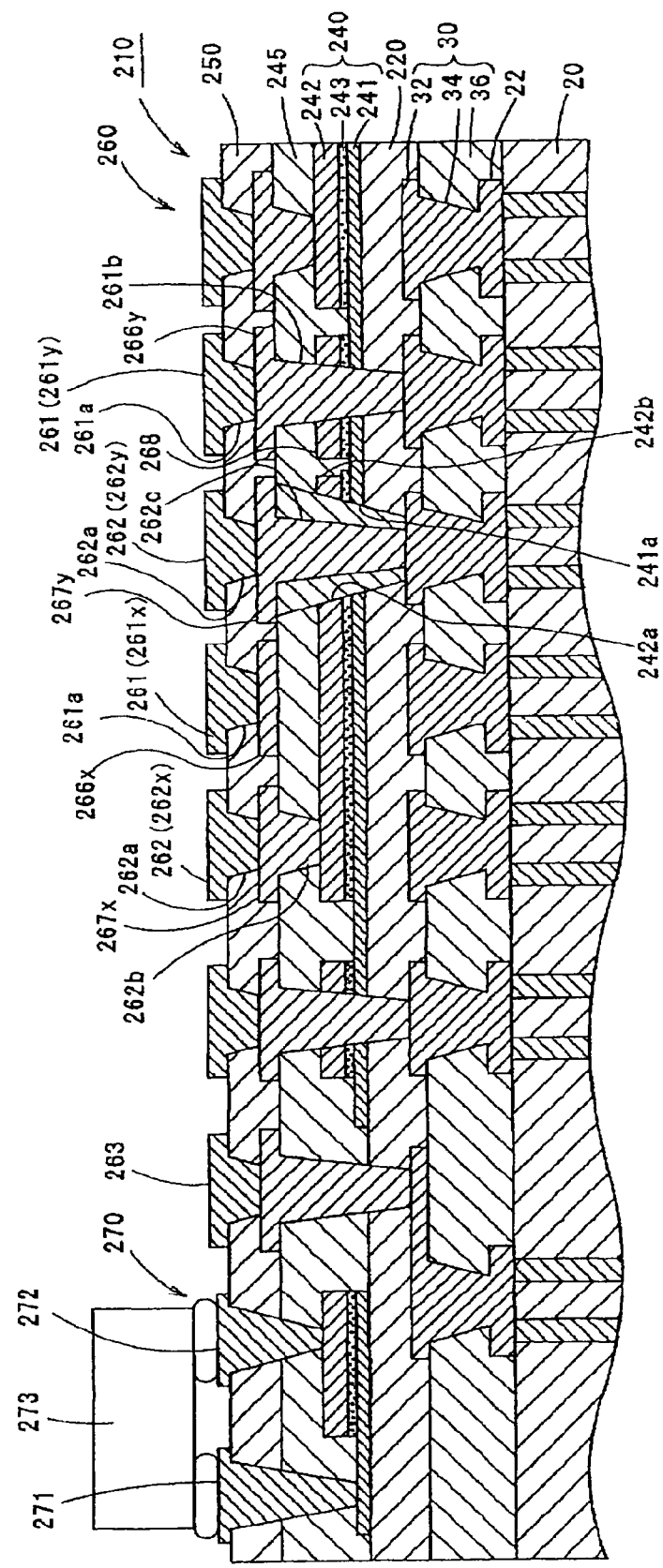
FIG. 8 is a longitudinal cross-sectional view of a multilayer printed wiring board 210 according to a second embodiment.

FIG. 8 is a longitudinal cross-sectional view of a multilayer printed wiring board 210 (which shows only the part to the left of the center line) according to a second embodiment. As shown in FIG. 8, the multilayer printed wiring board 210 of this embodiment includes a core substrate 20 similar to that of the first embodiment; a built-up portion 30 in which a wiring pattern 22 and a wiring pattern 32, which are stacked with a resin insulating layer 36 therebetween, are electrically connected through via holes 34, the built-up portion 30 being provided on the upper surface of the core substrate 20; an interlayer insulating layer 220 stacked on the built-up portion 30; a layered capacitor portion 240 which is stacked on the interlayer insulating layer 220 and which includes a first layered electrode 241, a second layered electrode 242, and a high-dielectric layer 243 provided between the first layered electrode 241 and the second layered electrode 242; an interlayer insulating layer 245 stacked on the layered capacitor portion 240; a stress relief portion 250 which is stacked on the interlayer insulating layer 245 and which is made of an elastic material; a mounting portion 260 on which a semiconductor device is mounted; and chip capacitor arrangement areas 270 provided around the mounting portion 260.

Figure 9:
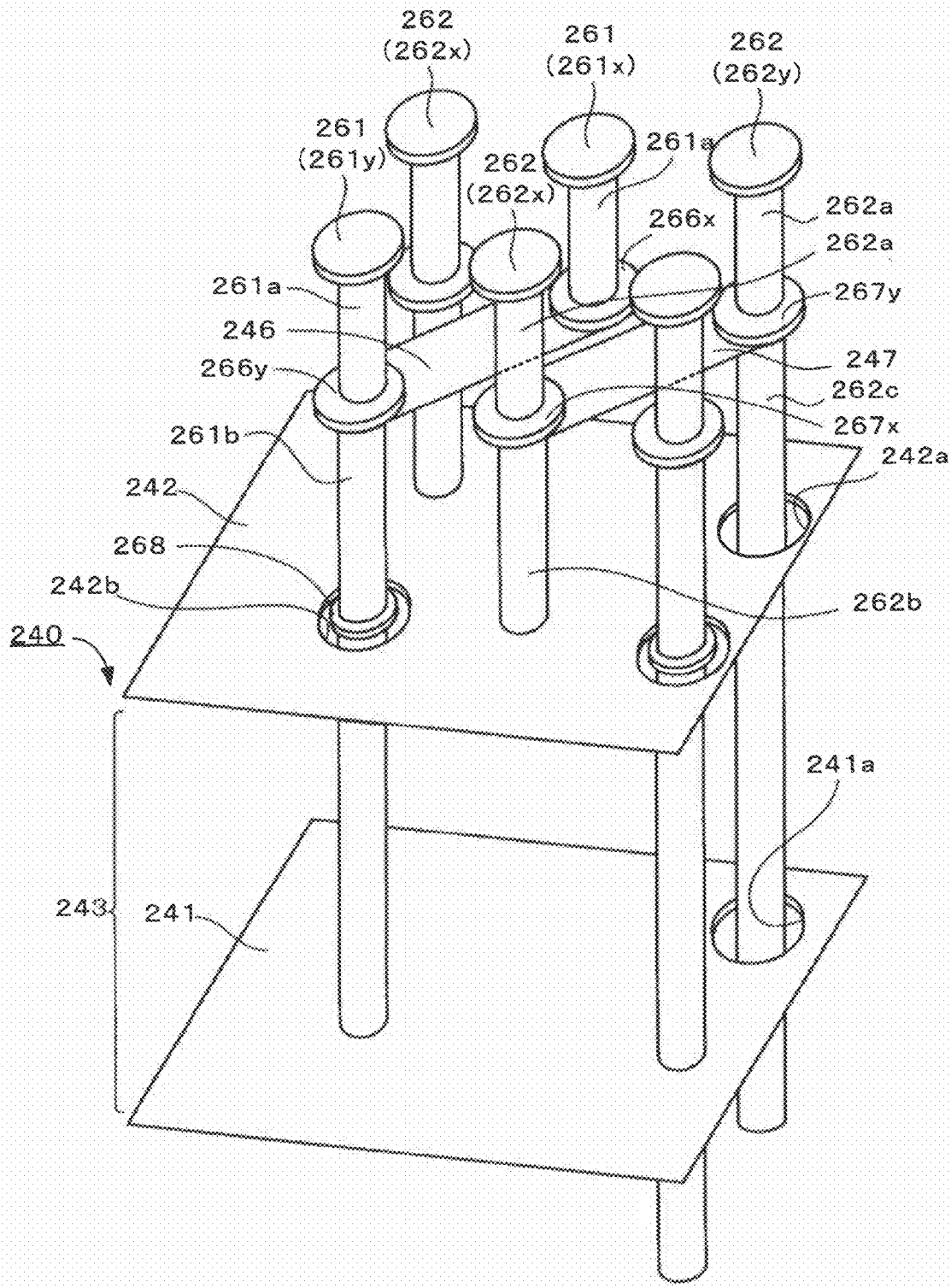
FIG. 9 is a schematic perspective view showing a layered capacitor portion 240.

In the layered capacitor portion 240 of this embodiment, the first layered electrode 241 is a copper electrode provided on the lower surface of the high-dielectric layer 243 and having a solid pattern, and is electrically connected to ground pads 261 of the mounting portion 260. For convenience of description, the ground pads 261 are classified into two types of pads, i.e., ground pads 261x and ground pads 261y. Among these pads, each of the ground pads 261x is electrically connected to a land 266x through a via hole 261a. No via hole is provided directly under this land 266x. In contrast, each of the ground pads 261y is connected to a land 266y through a via hole 261a. The land 266y is electrically connected to the first layered electrode 241 and a ground line of the wiring pattern 32 of the built-up portion 30 through a via hole 261b (first rod-shaped conductor). A land 268 connected to the via hole 261b is electrically independent from the second layered electrode 242. The land 266x connected to the ground pad 261x is electrically connected to the land 266y connected to the ground pad 261y via a wiring 246 (see FIG. 9). As a result, all of the ground pads 261 have the same electric potential. Thus, the first layered electrode 241 is connected to each of the ground pads 261 and connected to the ground line of the wiring pattern 32 of the built-up portion 30. Accordingly, the first layered electrode 241 is connected to an external ground line via this ground line. The first layered electrode 241 includes passing holes 241a through which via holes 262c described below penetrate in a non-contact manner. Since the via holes 262c are provided so as to correspond to some of the limited power supply pads 262y as described below, the number of passing holes 241a can be decreased. Here, the via holes 262c (second rod-shaped conductors) are provided so as to correspond to some of the power supply pads 262y. Specifically, the multilayer printed wiring board 210 is designed so that the ratio of the number of via holes 262c to the number of power supply pads 262 is within a range of 0.05 to 0.7. As a result, the area of the first layered electrode 241 is increased, and thus the capacitance of the layered capacitor portion 240 can be increased. In addition, malfunctioning of the semiconductor device mounted on the mounting portion 260 can be satisfactorily prevented. The number of passing holes 241a and the positions at which the passing holes 241a are formed are determined with consideration of the capacitance of the layered capacitor portion 240 and the like.

On the other hand, the second layered electrode 242 is a copper electrode provided on the upper surface of the high-dielectric layer 243 and having a solid pattern. The second layered electrode 242 is electrically connected to the power supply pads 262 of the mounting portion 260. For convenience of description, the power supply pads 262 are classified into two types of pads, i.e., power supply pads 262x and pads 262y for power supply. Among these pads, each of the power supply pads 262x is connected to a land 267x through a via hole 262a, and the land 267x is electrically connected to the second layered electrode 242 through a via hole 262b. On the other hand, each of the power supply pads 262y is connected to a land 267y through a via hole 262a, and the land 267y is electrically connected to a power supply line of the wiring pattern 32 of the built-up portion 30 through a via hole 262c without being in contact with the first layered electrode 241 and the second layered electrode 242. The land 267x connected to the power supply pad 262x is electrically connected to the land 267y connected to the power supply pad 262y via a wiring 247 (see FIG. 9). As a result, all of the power supply pads 262 have the same electric potential. Thus, the second layered electrode 242 is connected to each of the power supply pads 262 and connected to the power supply line of the wiring pattern 32 of the built-up portion 30. Accordingly, the second layered electrode 242 is connected to an external power supply line via this power supply line. Consequently, an electric power is supplied to the second layered electrode 242 from the power supply line of the wiring pattern 32 of the built-up portion 30 through the via hole 262c, the wiring 247, and the via hole 262b. The second layered electrode 242 includes passing holes 242a through which the via holes 262c penetrate in a non-contact manner and passing holes 242b for ensuring insulation with the lands 268. Since the via holes 262c are provided so as to correspond to some of the power supply pads 262y among the power supply pads 262, and the passing holes 242b are provided so as to correspond to some of the ground pads 261y among the ground pads 261. Accordingly, the number of passing holes 242a and the number of passing holes 242b can be decreased. Here, the via holes 261b are provided so as to correspond to some of the ground pads 261y. Specifically, the multilayer printed wiring board 210 is designed so that the ratio of the number of via holes 261b to the number of ground pads 261 is within a range of 0.05 to 0.7. As a result, the area of the second layered electrode 242 is increased, and thus the capacitance of the layered capacitor portion 240 can be increased. In addition, malfunctioning of the semiconductor device mounted on the mounting portion 260 can be satisfactorily prevented. The number of passing holes 242a and 242b and the positions at which the passing holes 242a and 242b are formed are determined with consideration of the capacitance of the layered capacitor portion 240 and the like.

Since the capacitance of the layered capacitor portion 240 can be increased as described above, a sufficient decoupling effect can be achieved and the power supply shortage of a transistor of the semiconductor device (IC) mounted on the mounting portion 260 does not easily occur. The ground pad 261x is connected to the ground pad 261y via the wiring 246 provided on the interlayer insulating layer 245, and the power supply pad 262x is connected to the power supply pad 262y via the wiring 247 provided on the interlayer insulating layer 245. Alternatively, such a wiring may be provided on any layer disposed above the second layered electrode (e.g., on the mounting portion), on the surface of the core substrate 20, or on the built-up portion 30. Furthermore, when the ground pads 261x are connected to the ground pads 261y via a wiring of any of the layers, and the power supply pads 262x are connected to the pads 262y for power supply with a wiring of any of the layers, the via holes 261a need not be provided directly under all of the ground pads 261 and the via holes 262a need not be provided directly under all of the power supply pads 262. Accordingly, the number of lands on a layer disposed directly under the mounting portion can also be decreased. Consequently, since the number of via holes and the number of lands to be provided are decreased, a high-density structure can be realized.

The stress relief portion 250 is made of an elastic material that is the same as that of the first embodiment. The ground pads 261, the power supply pads 262, and pads 263 for a signal, all of which are provided on the mounting portion 260, are arranged in a grid pattern or a checkered pattern as in the first embodiment. The numbers of these pads are also the same as those of the first embodiment. The pads 263 for a signal are not in contact with the first layered electrode 241 or the second layered electrode 242 of the layered capacitor portion 240. The ground pads 261 and the power supply pads 262 may be arranged near the center in a grid pattern or a checkered pattern, and the pads 263 for a signal may be arranged around the pads 261 and 262 in a grid pattern, a checkered pattern, or at random. A plurality of chip capacitor arrangement areas 270 are provided around the mounting portion 260. A plurality of pairs of ground pads 271 and power supply pads 272 that are used for connecting to terminals for a ground and terminals for a power supply, respectively, of a chip capacitor 273 are provided in each of the chip capacitor arrangement areas 270.

Each of the ground pads 271 is connected to a negative electrode of an external power supply via the first layered electrode 241 of the layered capacitor portion 240. Each of the power supply pads 272 is connected to a positive electrode of the external power supply via the second layered electrode 242. In this embodiment, the ground pads 261 correspond to first pads, and the power supply pads 262 correspond to second pads. The via holes 261b correspond to the first rod-shaped conductors, and the via holes 262c correspond to the second rod-shaped conductors.

Each of the ground pads 271 is connected to a negative electrode of an external power supply via the first layered electrode 241 of the layered capacitor portion 240. Each of the power supply pads 272 is connected to a positive electrode of the external power supply via the second layered electrode 242. In this embodiment, the ground pads 261 correspond to first pads, and the power supply pads 262 correspond to second pads. The via holes 261a and 261b correspond to the first rod-shaped conductors, and the via holes 262a and 262b correspond to the second rod-shaped conductors.

Figure 10:
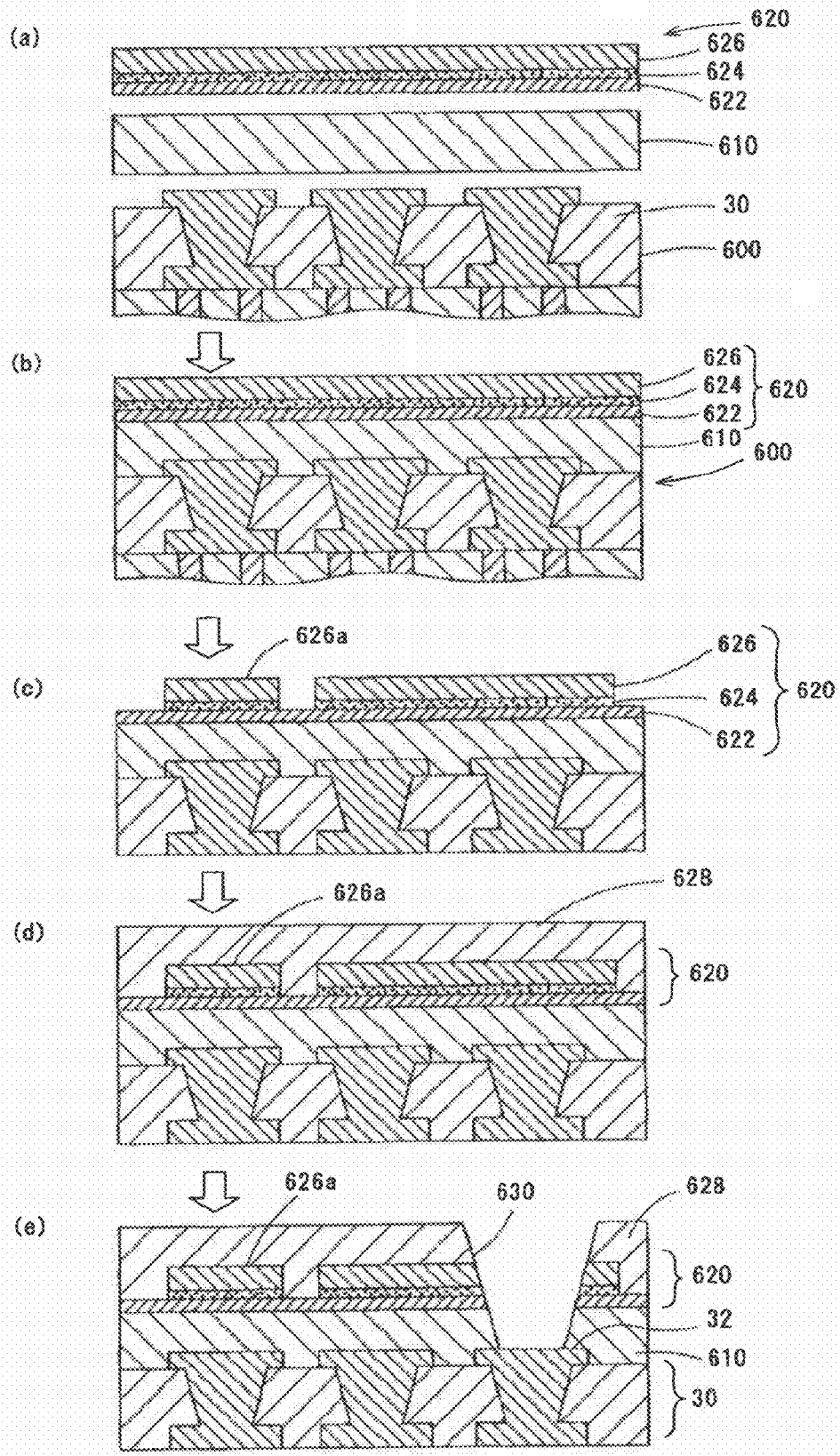
FIG. 10 includes views illustrating a process of producing the multilayer printed wiring board 210.
Figure 11:
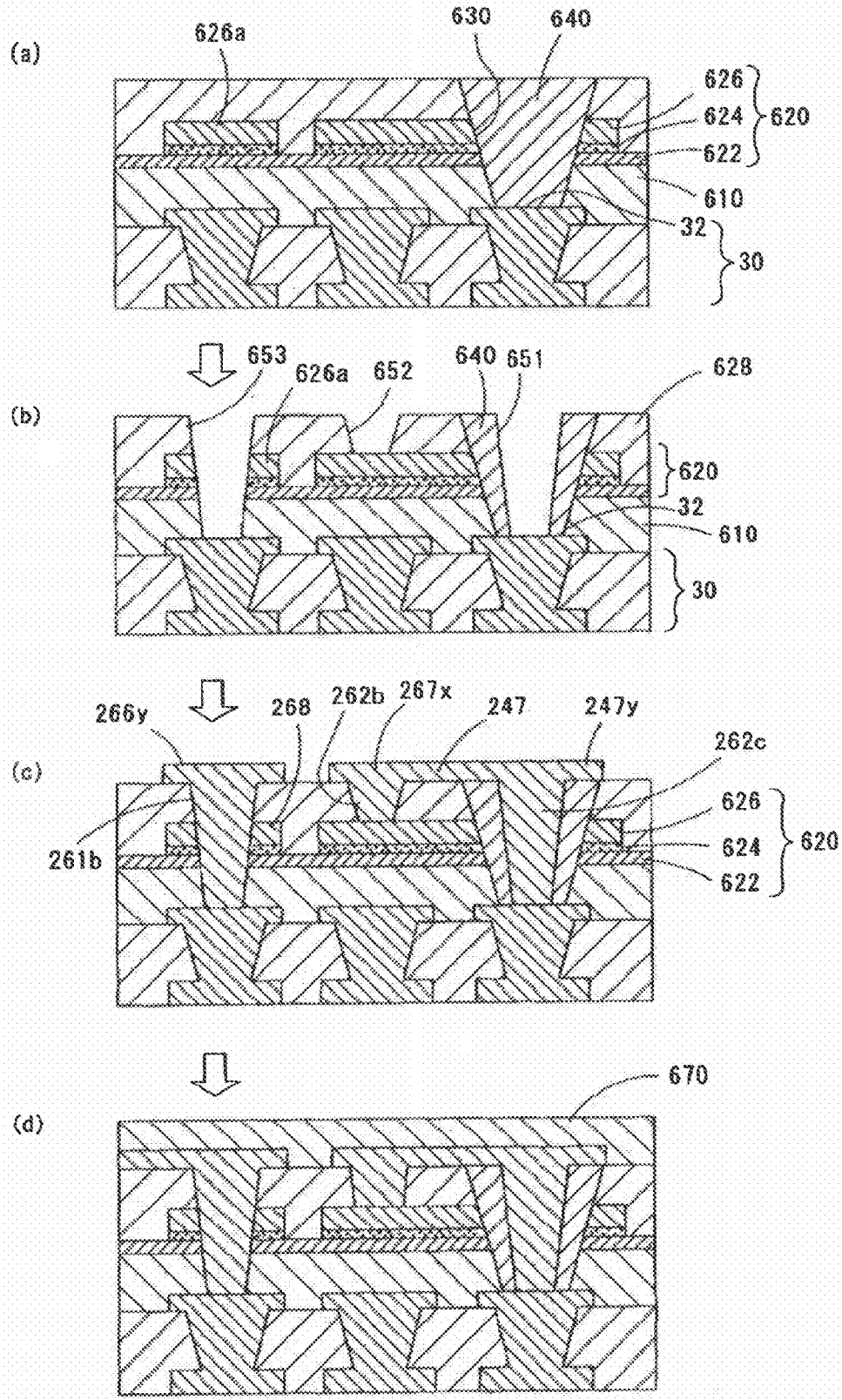
FIG. 11 includes views illustrating the process of producing the multilayer printed wiring board 210.
Figure 12:
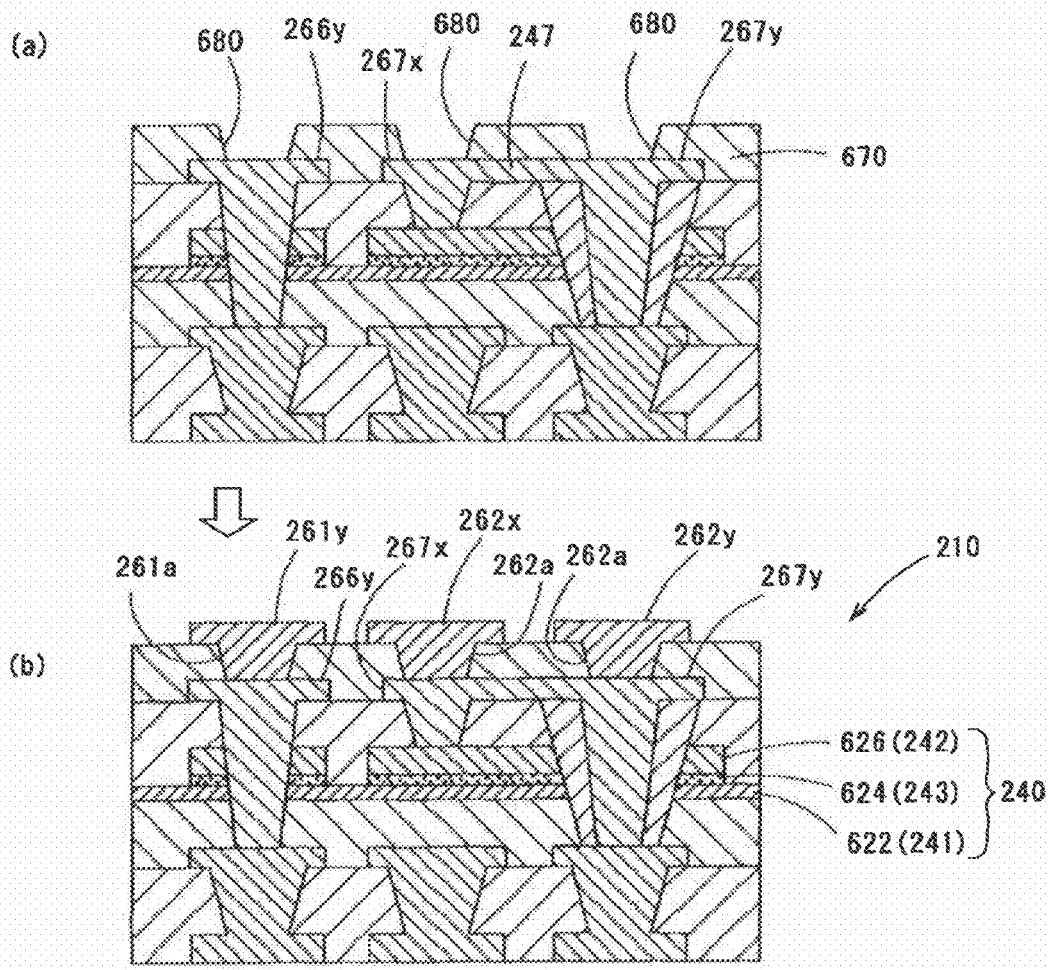
FIG. 12 includes views illustrating the process of producing the multilayer printed wiring board 210.

A process of producing the multilayer printed wiring board 210 of this embodiment will now be described with reference to FIGS. 10 to 12. FIG. 8 is a cross-sectional view when a portion in which the power supply pads 262 and the ground pads 261 that are disposed directly under the semiconductor device, i.e., disposed directly under a die, are alternately arranged in a grid pattern or a checkered pattern is cut. FIGS. 10 to 12 are cross-sectional views when a portion in which the power supply pads 262 and the ground pads 261 are not alternately arranged is cut.

First, as shown in FIG. 10(a), a substrate 600 in which a built-up portion 30 was provided on at least one surface of a core substrate 20 was prepared. An interlayer insulating layer 610 (a thermosetting insulating film, manufactured by Ajinomoto Co., Inc., ABF-45SH) was bonded onto the built-up portion 30 using a vacuum laminator under laminating conditions at a temperature in the range of 50° C. to 150° C. and at a pressure in the range of 0.5 to 1.5 MPa. Subsequently, a high-dielectric sheet 620 (produced by the same process as that used for the high-dielectric sheet 520 of the first embodiment) prepared in advance was bonded onto the interlayer insulating layer 610 (which was to be formed into the interlayer insulating layer 220 shown in FIG. 8) with a vacuum laminator under laminating conditions at a temperature in the range of 50° C. to 150° C. and a pressure in the range of 0.5 to 1.5 MPa and was then dried at 150° C. for one hour (see FIG. 10(b)). Each of copper foils 622 and 626 of the high-dielectric sheet 620 was a solid layer on which no circuits are formed. Subsequently, the high-dielectric sheet 620 was etched by a tenting process. An etchant containing cupric chloride was used in the etching process. The process was performed within a short time such that the copper foil 626 and a high-dielectric layer 624 were completely etched, and the copper foil 622 was then slightly etched (see FIG. 10(c)). In FIG. 10(c), isolated lands 626a (which were formed into the lands 268 shown in FIG. 8) were formed by separating a part of the copper foil 626 by etching. An interlayer insulating layer (which was to be formed into the interlayer insulating layer 245 shown in FIG. 7, a thermosetting insulating film, manufactured by Ajinomoto Co., Inc., ABF-45SH) 628 was then laminated on the high-dielectric sheet 620 (see FIG. 10(d)). Next, through-holes 630 were formed at predetermined positions of the above substrate having the interlayer insulating layer 628 thereon using a carbon dioxide gas laser, a UV laser, a YAG laser, an excimer laser, or the like (see FIG. 10(e)). The through-holes 630 were formed so as to penetrate through the interlayer insulating layer 628, the high-dielectric sheet 620, and the interlayer insulating layer 610 and to reach the surface of a wiring pattern 32 of the built-up portion 30. Regarding the laser conditions, a UV laser device manufactured by Hitachi Via Mechanics, Ltd. was used at an output in the range of 3 to 10 kW, at a frequency in the range of 30 to 60 kHz, and with the number of shots of 54.

After the through-holes 630 were formed, a resin 640 for filling through-holes (prepared by the same process as that used for the resin 532 for filling through-holes of the first embodiment) was filled in the through-holes 630 and then dried (see FIG. 11(a)). Subsequently, through-holes 651, 652, and 653 were formed at predetermined positions of the above substrate using a carbon dioxide gas laser, a UV laser, a YAG laser, an excimer laser, or the like (see FIG. 11(b)). The through-holes 651 were formed so as to penetrate through the resin 640 for filling through-holes and to reach the surface of the wiring pattern 32 of the built-up portion 30. The through-holes 652 were formed so as to penetrate through the interlayer insulating layer 628 and to reach the surface of the copper foil 626. The through-holes 653 were formed so as to penetrate through the interlayer insulating layer 628, the high-dielectric sheet 620 (including the land 626a, the high-dielectric layer 624, and the copper foil 622), and the interlayer insulating layer 610 and to reach the surface of the wiring pattern 32 of the built-up portion 30. Regarding the order of the formation of these through-holes 651, 652, and 653, first, the through-holes 651 were formed, the through-holes 652 were then formed, and lastly, the through-holes 653 were formed. The depths of the through-holes were controlled by changing the type of laser used and the number of laser shots. For example, each of the through-holes 651 was formed using a $CO_2$ laser via a mask diameter of 1.4 mm, at an energy density of 2.0 mj, and a number of shots of 3; each of the through-holes 652 was formed under the same conditions as those used for the through-holes 651 except that the number of shots was changed to 1; and each of the through-holes 653 was formed under the same conditions as those used for the through-holes 651 except that a UV laser was used and the number of shots was changed to 56 (output: 3 to 10 W, frequency: 30 to 60 kHz). The through-holes 630 were formed so as to correspond to not all of the power supply pads 262 shown in FIG. 8 but some of the pads 262, i.e., the power supply pads 262y. The through-holes 653 were formed so as to correspond to not all of the ground pads 261 shown in FIG. 8 but some of the pads 261, i.e., the ground pads 261y.

Drying and curing were then performed at 170° C. for three hours to completely cure the resin 640. Subsequently, a catalyst was applied on the surface of the substrate. By employing a normal semi-additive process, each of the through-holes 651, 652, and 653 was filled with a metal to form via holes 262c, 262b, and 261b, respectively; lands 267y, 267x, and 266y were formed on the via holes 262c, 262b, and 261b, respectively; and a wiring 247 connecting the land 267x to the land 267y was also formed (see FIG. 11(c)). The wiring pattern 32 of the built-up portion 30 was connected to the copper foil 626 (which was to be formed into the second layered electrode 242) via this wiring 247. Although not shown in the figure, the land 266x and the wiring 246 shown in FIG. 9 were also formed at the same time. Subsequently, a stress relief sheet 670 (which was to be formed into the stress relief portion 250 shown in FIG. 8, and the production process of which is described in that of the stress relief sheet 550 of the first embodiment) was laminated (see FIG. 11(d)).

Subsequently, through-holes 680 were formed in the stress relief sheet 670 at positions directly on the lands 267y, 267x, and 266y (see FIG. 12(a)). A roughening treatment, a complete curing, a catalyst application, chemical copper plating, the formation of a plating resist, copper electroplating, the removal of the plating resist, and quick etching were then performed to fill each of the through-holes 680 with a metal, and pads were formed on the upper surface of the metal (see FIG. 12(b)). Thus, a via hole 262a and a power supply pad 262y were formed on the land 267y. A via hole 262a and a power supply pad 262x were formed on the land 267x. A via hole 261a and a ground pad 261y were formed on the land 266y. Although not shown in the figure, the via hole 261a and the ground pad 261x were also formed on the land 266x shown in FIGS. 8 and 9. Thus, the multilayer printed wiring board 210 shown in FIG. 8 was produced. The copper foil 622 corresponds to the first layered electrode 241, the copper foil 626 corresponds to the second layered electrode 242, and the high-dielectric layer 624 corresponds to the high-dielectric layer 243. These constitute the layered capacitor portion 240. In the second embodiment, when the ground pads 261x are connected to the ground pads 261y via any of the layers (for example, on the mounting portion 260), the via holes 261a and the lands 266x are not necessary. Similarly, when the pads 262x for an electrode are connected to the pads 262y for an electrode via any of the layers (for example, on the mounting portion 260), the via holes 262a, the lands 267x, and the via holes 262b, which are disposed directly under the power supply pads 262x, are also not necessary. In such a case, the number of via holes and the number of lands can be decreased.

Subsequently, solder bumps may be formed on each terminal of the mounting portion 260. When chip capacitors 273 are mounted as shown in FIG. 8, the pads 271 and 272 can be formed as in the first embodiment.

According to the multilayer printed wiring board 210 of the second embodiment described above in detail, the same advantages as those in the above-described first embodiment can be achieved. In addition, in this embodiment, electric charges from an external power supply source are charged from the built-up portion 30 to the high-dielectric sheet 620 through the via holes 262c and 262b without bypassing the layered capacitor portion 240. Consequently, the length of a wiring connecting the external power supply source to the second layered electrode 242, which is a power supply electrode of the layered capacitor portion 240, and the length of a wiring connecting the external power supply source to the first layered electrode 241, which is a ground electrode of the layered capacitor portion 240 can be shortened. Therefore, even when a semiconductor device (IC) that is driven at a high speed is mounted on the mounting portion 260, a shortage of charges of the layered capacitor portion 240 does not easily occur.

Figure 13:
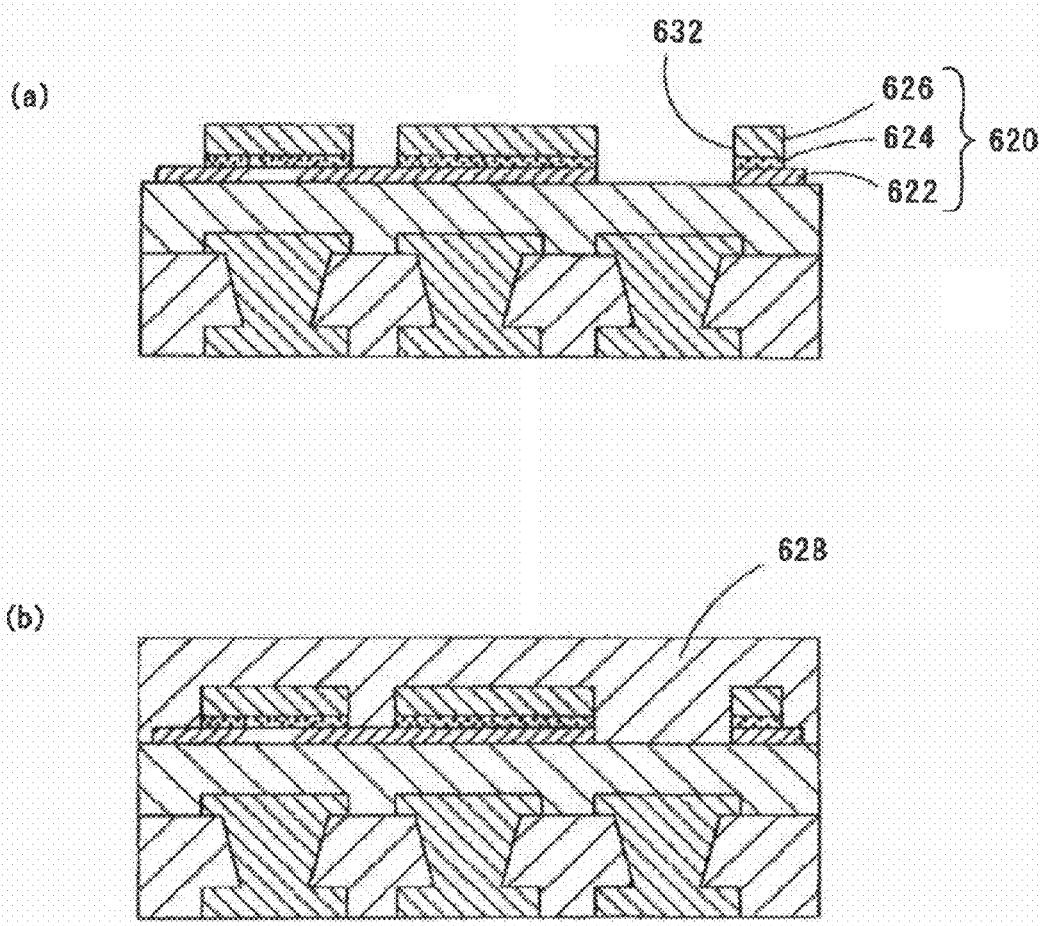
FIG. 13 includes views illustrating a process of producing another multilayer printed wiring board 210.

In the production process described above, after the step shown in FIG. 10(c), the interlayer insulating layer 628 was laminated (see FIG. 10(d)), and the through-holes 630 were formed at predetermined positions of the interlayer insulating layer 628 (see FIG. 10(e)). Subsequently, the through-holes 630 were filled with the resin 640 for filling through-holes, and the resin 640 was then dried (see FIG. 11(a)). Furthermore, the through-holes 651 were formed in the resin 640 for filling through-holes (see FIG. 11(b)). Alternatively, the following process may be employed. Specifically, after the step shown in FIG. 10(c), a commercially available dry film is applied on the surface of the substrate. Subsequently, a part of the high-dielectric sheet 620 disposed at a position where the via hole 262c (see FIG. 11(c)) is to be formed is removed by a tenting process so that the etched area is larger than the area of the via hole 262c, thus forming an expanded hole 632 (see FIG. 13(a)). Subsequently, an interlayer insulating layer 628 is laminated on the high-dielectric sheet 620, and the expanded hole 632 formed by removing the high-dielectric sheet 620 by etching is also filled with the interlayer insulating layer 628. The substrate is then dried (see FIG. 13(b)). The steps of forming the through-holes 651, 652, and 653, and the subsequent steps of the second embodiment may then be performed. In this case, the step of filling the through-holes 630 can be eliminated.

EXAMPLES

Experimental Examples 1 to 5

In Experimental Examples 1 to 5, in the first embodiment, the number of times the steps of spin-coating, drying, and sintering of the procedure (4) in the process of preparing the high-dielectric sheet were repeated was four, and a high-dielectric layer 143 having a thickness of 0.12 μm was prepared. By varying the number of second rod-shaped conductors 162b and the number of first rod-shaped conductors 161c of the multilayer printed wiring board 110 shown in FIG. 2 in each experimental example, the ratio of the number of second rod-shaped conductors 162b to the number of power supply pads 162 and the ratio of the number of first rod-shaped conductors 161c to the number of ground pads 161 were controlled as shown in Table 1. Each of the number of power supply pads 162 and the number of ground pads 161 was 10,000. By adjusting the sizes of passing holes 141a and 142a, the capacitance at a position directly under a die of the layered capacitor portion 140 was controlled to 3.8 μF.

Experimental Examples 6 to 10

In Experimental Examples 6 to 10, in the second embodiment, the number of times the steps of spin-coating, drying, and sintering of the procedure (4) in the process of preparing the high-dielectric sheet were repeated was four, and a high-dielectric layer 143 having a thickness of 0.12 μm was prepared. By varying the number of via holes 262c (second rod-shaped conductors) and the number of via holes 261b (first rod-shaped conductors) of the multilayer printed wiring board 210 shown in FIG. 7 in each experimental example, the ratio of the number of via holes 262c to the number of power supply pads 262 and the ratio of the number of via holes 261b to the number of ground pads 261 were controlled as shown in Table 2. Each of the number of power supply pads 262 and the number of ground pads 261 was 10,000. By adjusting the sizes of passing holes 241a, 242a, and 242b, the capacitance at a position directly under a die of the layered capacitor portion was controlled to 3.8 μF.

Evaluation Test 1

A heat cycle test was performed using the multilayer printed wiring boards of Experimental Examples 1 to 10 as follows.

Conditions for heat cycle test: A cycle consisting of cooling at −55° C. for 30 minutes and heating at 125° C. for 30 minutes was repeated 1,000 times.

Subsequently, an IC chip with a drive frequency of 3.6 GHz, and an FSB of 1,066 MHz was mounted on each wiring board.

Simultaneous switching was repeated 100 times, and the occurrence of malfunctioning of the IC chip was examined using a Pulse Pattern Generator/Error Detector (manufactured by Advantest Corporation, trade name: D3186/3286). When malfunctioning did not occur, the sample was evaluated as ◯ (good). When malfunctioning occurred, the sample was evaluated as x (not good). The results are shown in Tables 1 and 2. As is apparent from Tables 1 and 2, when the ratio of the number of rod-shaped conductors to the number of pads was 0.01, malfunctioning of the mounted IC chip occurred.

The reason for this is believed to be as follows. Since the number of rod-shaped conductors is small, when the state of electrical connection of a rod-shaped conductor was degraded by the heat cycle test, other rod-shaped conductors could not adequately compensate for the effect of this degradation. As a result, malfunctioning occurred. When the ratio of the number of rod-shaped conductors to the number of pads was 1, malfunctioning of the mounted IC chip occurred. The reason for this is believed to be as follows. Since the number of through-holes penetrating through the high-dielectric layer of the layered capacitor portion and the amount of resin filled in the through-holes increased, the number of portions where the high-dielectric layer was contracted or expanded was also increased. As a result, cracks were generated in the brittle ceramic high-dielectric layer.

TABLE 1

| Example | Ratio of Rod-shaped Conductors | | Evaluation of Evaluation Test 1 |
| --- | --- | --- | --- |
| | 162b/162 | 161c/161 | |
| Example 1 | 1 | 1 | X |
| Example 2 | 0.7 | 0.7 | ◯ |
| Example 3 | 0.1 | 0.1 | ◯ |
| Example 4 | 0.05 | 0.05 | ◯ |
| Example 5 | 0.01 | 0.01 | X |

TABLE 2

| Example | Ratio of Rod-shaped Conductors | | Evaluation of Evaluation Test 1 |
| --- | --- | --- | --- |
| | 262c/262 | 261b/261 | |
| Example 6 | 1 | 1 | X |
| Example 7 | 0.7 | 0.7 | ◯ |
| Example 8 | 0.1 | 0.1 | ◯ |
| Example 9 | 0.05 | 0.05 | ◯ |
| Example 10 | 0.01 | 0.01 | X |

In Experimental Examples 1 to 5 and Experimental Examples 6 to 10, the capacitance at a position directly under the die of the layered capacitor portion 140 or 240 was adjusted to 3.8 μF Furthermore, by varying the number of times the steps of spin-coating, drying, and sintering of the procedure (4) in the process of preparing the high-dielectric sheet were repeated, and varying the sizes of the through-holes of the first and second layered electrodes, additional samples of Experimental Examples 1 to 5 and Experimental Examples 6 to 10 having a capacitance at a position directly under the die of 0.06, 0.3, 0.4, 0.5, 0.8, 1, 2, 5, 10, 16, or 20 μF were prepared and evaluated by the method of Evaluation Test 1. According to the results, when the capacitance was in the range of 0.5 to 5 μF, results similar to those of Experimental Examples 1 to 5 and Experimental Examples 6 to 10 were obtained. However, when the capacitance was out of the above range, malfunctioning infrequently occurred even in the case where the ratio of the number of rod-shaped conductors to the number of pads was in the range of 0.05 to 0.7.

INDUSTRIAL APPLICABILITY

The multilayer printed wiring board of the present invention is used for mounting a semiconductor device such as an IC chip. For example, the multilayer printed wiring board of the present invention is used in the electrical industry, the telecommunication industry, and the like.

The invention claimed is:

1. A method for manufacturing a multilayer printed wiring board including a built-up portion in which a plurality of wiring patterns stacked with insulating layers therebetween are electrically connected to each other through via holes provided in the insulating layers, comprising the steps of:
forming a layered capacitor portion including a ceramic high-dielectric layer, a first layered electrode, and a second layered electrode, the first layered electrode and the second layered electrode sandwiching the high-dielectric layer and having different electric potentials;
forming a mounting portion on which a semiconductor device electrically connected to the wiring patterns can be mounted and which includes first pads each connected to one of a ground electrode and a power supply electrode of the semiconductor device, and second pads each connected to the other of the ground electrode and the power supply electrode of the semiconductor device;
the layered capacitor portion which is provided between the mounting portion and the built-up portion, which includes the ceramic high-dielectric layer, the first layered electrode, and the second layered electrode, the first layered electrode and the second layered electrode sandwiching the high-dielectric layer and having different electric potentials, and in which the first layered electrode is electrically connected to the first pads so as to have the same electric potential as the first pads and the second layered electrode is electrically connected to the second pads so as to have the same electric potential as the second pads,
forming first rod-shaped conductors, each constituting at least a part of a conducting path that electrically connects the first pads to a ground line or a power supply line of the wiring patterns and which passes through the second layered electrode in a non-contact manner; and
forming second rod-shaped conductors, each constituting at least a part of a conducting path that electrically connects the second pads to the power supply line or the ground line of the wiring patterns and which passes through the first layered electrode in a non-contact manner,
wherein the ratio of the number of the first rod-shaped conductors to the number of the first pads is in the range of 0.05 to 0.7, and
wherein the ratio of the number of the second rod-shaped conductors to the number of the second pads is in the range of 0.05 to 0.7.

2. The method according to claim 1,
wherein the high-dielectric layer is prepared by sintering a high-dielectric material separately from the built-up portion, and the sintered high-dielectric layer is joined onto the built-up portion.

3. The method according to claim 2,
wherein the high-dielectric layer is prepared by sintering a raw material containing at least one metal oxide selected from the group consisting of barium titanate ($BaTiO_3$), strontium titanate ($SrTiO_3$), tantalum oxides ($TaO_3$ and $Ta_2O_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT).

4. The method according to claim 1,
wherein the method forms at least two second rod-shaped conductors, and the second rod-shaped conductors are independent rod-shaped conductors penetrating through not only the first layered electrode but also the second layered electrode in a non-contact manner.

5. The method according to claim 1, wherein the first layered electrode is provided on the lower surface of the high-dielectric layer as a solid pattern having passing holes through which the second rod-shaped conductors pass in a non-contact manner, and the second layered electrode is provided on the upper surface of the high-dielectric layer as a solid pattern having passing holes through which the first rod-shaped conductors pass in a non-contact manner.

6. The method according to claim 1,
wherein some of the first pads include the first rod-shaped conductors, and the rest of the first pads do not include any of the first rod-shaped conductors and are electrically connected to the first pads including the first rod-shaped conductors, and
some of the second pads include the second rod-shaped conductors, and the rest of the second pads do not include any of the second rod-shaped conductors and are electrically connected to the second pads including the second rod-shaped conductors.

7. The method according to claim 1, wherein at least some of the first rod-shaped conductors and at least some of the second rod-shaped conductors are alternately arranged in a grid pattern or a checkered pattern.

8. The method according to claim 1, wherein the distance between the first layered electrode and the second layered electrode of the layered capacitor portion is 10 µm or less, which is a distance at which short circuits do not substantially occur.

9. The method according to claim 1, wherein the layered capacitor portion is formed to be directly under the semiconductor device mounted on the mounting portion.

10. The method according to claim 1, further comprising the step of:
forming a chip capacitor which is disposed at the side of a surface having the mounting portion thereon and which is connected to the first layered electrode and the second layered electrode of the layered capacitor portion.

11. The method according to claim 1, further comprising the step of:
forming a stress relief portion which is provided between the mounting portion and the layered capacitor portion and which is made of an elastic material.

12. The method according to claim 11, wherein the stress relief portion is formed in only an area directly under the semiconductor device mounted on the mounting portion.

13. The method according to claim 11,
wherein the material of the stress relief portion is at least one material selected from the organic resin sheet group consisting of a modified epoxy resin sheet, a polyphenylene ester resin sheet, a polyimide resin sheet, a cyanoester resin sheet, and an imide resin sheet.

14. The method according to claim 13, wherein the organic resin sheet comprises at least one resin selected from the group consisting of thermoplastic resins such as a polyolefin resin and a polyimide resin, thermosetting resins such as a silicone resin, and rubber resins such as SBR, NBR, and a urethane.

15. The method according to claim 13,
wherein the organic resin sheet comprises at least one compound selected from the group consisting of silica, alumina, and zirconia.

16. The method according to claim 1,
wherein the stress relief portion has a Young's modulus in the range of 10 to 1,000 MPa.

17. The method according to claim 1,
wherein the capacitance at a position directly under a die of the layered capacitor portion is in the range of 0.5 to 5 µF.

* * * * *